United States Patent
Comeau et al.

(10) Patent No.: US 9,056,227 B2
(45) Date of Patent: *Jun. 16, 2015

(54) GOLF BALL COMPRISING A CORE HAVING A SHALLOW HARDNESS GRADIENT

(71) Applicant: Acushnet Company, Fairhaven, MA (US)

(72) Inventors: Brian Comeau, Berkley, MA (US); Nelson Araujo, New Bedford, MA (US); Dennis Britton, North Dartmouth, MA (US)

(73) Assignee: Acushnet Company, Fairhaven, MA (US)

( * ) Notice: Subject to any disclaimer, the term of this patent is extended or adjusted under 35 U.S.C. 154(b) by 237 days.

This patent is subject to a terminal disclaimer.

(21) Appl. No.: 13/721,139

(22) Filed: Dec. 20, 2012

(65) Prior Publication Data

US 2013/0109506 A1 May 2, 2013

Related U.S. Application Data

(63) Continuation-in-part of application No. 12/647,584, filed on Dec. 28, 2009, now Pat. No. 8,500,575, which is a continuation-in-part of application No. 12/558,826, filed on Sep. 14, 2009, now Pat. No. 7,857,714, which is a continuation of application No. 12/186,877, filed on Aug. 6, 2008, now Pat. No. 7,803,069, which is a continuation of application No. 11/832,197, filed on Aug. 1, 2007, now Pat. No. 7,410,429, which is a continuation-in-part of application No. 11/829,461, filed on Jul. 27, 2007, now Pat. No. 7,537,530, which is a continuation-in-part of application No. 11/772,903, filed on Jul. 3, 2007, now Pat. No. 7,537,529.

(51) Int. Cl.
| | |
|---|---|
| A63B 37/04 | (2006.01) |
| A63B 37/00 | (2006.01) |
| C08K 5/00 | (2006.01) |
| C08K 5/01 | (2006.01) |
| G03F 7/027 | (2006.01) |
| A63B 37/08 | (2006.01) |
| A63B 45/00 | (2006.01) |

(52) U.S. Cl.
CPC ......... *A63B 37/0063* (2013.01); *A63B 37/0092* (2013.01); *C08K 5/0025* (2013.01); *C08K 5/01* (2013.01); *A63B 37/005* (2013.01); *A63B 37/0003* (2013.01); *A63B 37/0051* (2013.01); *A63B 37/0062* (2013.01); *A63B 37/0064* (2013.01); *A63B 37/0074* (2013.01); *A63B 37/0075* (2013.01); *A63B 37/0031* (2013.01); *A63B 37/0061* (2013.01); *A63B 37/0065* (2013.01); *A63B 37/08* (2013.01); *A63B 45/00* (2013.01); *A63B 2037/087* (2013.01); *G03F 7/027* (2013.01)

(58) Field of Classification Search
USPC .................. 473/371–374, 376, 377
See application file for complete search history.

(56) References Cited

U.S. PATENT DOCUMENTS

| | | | |
|---|---|---|---|
| 3,572,721 A | 3/1971 | Harrison et al. | |
| 3,784,209 A | 1/1974 | Berman | |
| 3,986,802 A | 10/1976 | Isom | |
| 4,027,080 A | 5/1977 | Amtmann et al. | |
| 4,117,017 A | 9/1978 | Morgan et al. | |
| 4,135,047 A | 1/1979 | Morgan | |
| 4,556,695 A | 12/1985 | Ijntema | |
| 4,570,937 A | 2/1986 | Yamada | |
| 4,650,193 A | 3/1987 | Molitor et al. | |
| 4,948,820 A | 8/1990 | Addeo et al. | |
| 5,033,748 A | 7/1991 | Ebisuno | |
| 5,118,763 A | 6/1992 | Aoki et al. | |
| 5,334,673 A | 8/1994 | Wu | |
| 5,484,870 A | 1/1996 | Wu | |
| 5,516,110 A | 5/1996 | Yabuki et al. | |
| 5,697,856 A | 12/1997 | Moriyama et al. | |
| 5,730,664 A | 3/1998 | Asakura et al. | |
| 5,733,206 A | 3/1998 | Nesbitt et al. | |
| 5,782,707 A | 7/1998 | Yamagishi et al. | |
| 5,803,834 A | 9/1998 | Yamagishi et al. | |
| 5,957,784 A | 9/1999 | Asakura et al. | |
| 5,976,443 A | 11/1999 | Nesbitt et al. | |
| 6,057,403 A | 5/2000 | Sullivan et al. | |
| 6,113,831 A | 9/2000 | Nesbitt et al. | |
| 6,267,692 B1 | 7/2001 | Higuchi et al. | |
| 6,319,154 B1 | 11/2001 | Yoshida et al. | |
| 6,432,342 B1 | 8/2002 | Nesbitt et al. | |
| 6,494,793 B1 * | 12/2002 | Ohama | 473/371 |
| 6,494,794 B1 | 12/2002 | Ohama | |
| 6,506,851 B2 | 1/2003 | Wu | |
| 6,533,683 B2 | 3/2003 | Watanabe | |
| 6,537,158 B2 | 3/2003 | Watanabe | |
| 6,632,147 B2 | 10/2003 | Cavallaro et al. | |
| 6,659,888 B2 | 12/2003 | Endo et al. | |
| 6,679,791 B2 | 1/2004 | Watanabe | |
| 6,689,860 B2 | 2/2004 | Iwami | |
| 6,739,986 B2 | 5/2004 | Higuchi et al. | |
| 6,805,644 B1 | 10/2004 | Moriyama et al. | |
| 6,815,521 B2 | 11/2004 | Iwami | |
| 6,835,794 B2 * | 12/2004 | Wu et al. | 528/64 |
| 6,837,803 B2 | 1/2005 | Nanba et al. | |
| 6,921,345 B2 | 7/2005 | Higuchi et al. | |
| 6,932,720 B2 | 8/2005 | Hogge et al. | |
| 6,960,629 B2 * | 11/2005 | Voorheis et al. | 525/256 |
| 6,967,229 B2 | 11/2005 | Voorheis | |
| 7,004,854 B2 | 2/2006 | Hogge et al. | |
| 7,153,224 B2 | 12/2006 | Higuchi et al. | |
| 7,182,702 B2 | 2/2007 | Hogge et al. | |
| 2002/0006837 A1 | 1/2002 | Dalton et al. | |
| 2003/0078115 A1 | 4/2003 | Kennedy et al. | |
| 2003/0236135 A1 | 12/2003 | Hogge et al. | |
| 2005/0009992 A1 * | 1/2005 | Voorheis | 525/244 |
| 2005/0176523 A1 | 8/2005 | Boehm | |

* cited by examiner

*Primary Examiner* — Gene Kim
*Assistant Examiner* — John E Simms, Jr.
(74) *Attorney, Agent, or Firm* — Margaret C. Barker

(57) ABSTRACT

A golf ball comprising: a core having an outer surface and a geometric center and being formed from a substantially homogenous rubber composition comprising a carbon-carbon initiator, wherein the outer surface has a hardness that differs from a hardness at the geometric center by up to about 10 Shore C; optionally an intermediate layer disposed about the core; and a cover layer disposed about the core (or intermediate layer where present).

24 Claims, No Drawings

GOLF BALL COMPRISING A CORE HAVING A SHALLOW HARDNESS GRADIENT

CROSS-REFERENCE TO RELATED APPLICATIONS

This application is a continuation-in-part of co-pending U.S. patent application Ser. No. 12/647,584 filed Dec. 28, 2009, which is a continuation-in-part of co-pending U.S. patent application Ser. No. 12/558,826, filed Sep. 14, 2009, which is a continuation of co-pending U.S. patent application Ser. No. 12/186,877, filed Aug. 6, 2008, which is a continuation of U.S. Pat. No. 7,410,429, filed Aug. 1, 2007, which is a continuation-in-part of U.S. Pat. No. 7,537,530, filed Jul. 27, 2007, which is a continuation-in-part of U.S. Pat. No. 7,537,529, filed Jul. 3, 2007. The disclosure of each related application is incorporated herein by reference.

FIELD OF THE INVENTION

This invention relates generally to golf balls with cores having hardness gradients.

BACKGROUND OF THE INVENTION

Solid golf balls are typically made with a solid core encased by a cover, both of which can have multiple layers, such as a dual core having a solid center and an outer core layer, or a multi-layer cover having an inner. Generally, golf ball cores and/or centers are constructed with a thermoset rubber, typically a polybutadiene-based composition. The cores are usually heated and crosslinked to create certain characteristics, such as higher or lower compression, which can impact the spin rate of the ball and/or provide better "feel." These and other characteristics can be tailored to the needs of golfers of different abilities. From the perspective of a golf ball manufacturer, it is desirable to have cores exhibiting a wide range of properties, such as resilience, durability, spin, and "feel," because this enables the manufacturer to make and sell many different types of golf balls suited to differing levels of ability.

Heretofore, most single core golf ball cores have had a conventional hard-to-soft hardness gradient from the surface of the core to the center of the core, otherwise known as a "positive hardness gradient." The patent literature contains a number of references that discuss a hard surface to soft center hardness gradient across a golf ball core.

U.S. Pat. No. 4,650,193 to Molitor et al. generally discloses a hardness gradient in the surface layers of a core by surface treating a slug of curable elastomer with a cure-altering agent and subsequently molding the slug into a core. This treatment allegedly creates a core with two zones of different compositions, the first part being the hard, resilient, central portion of the core, which was left untreated, and the second being the soft, deformable, outer layer of the core, which was treated by the cure-altering agent. The two "layers" or regions of the core are integral with one another and, as a result, achieve the effect of a gradient of soft surface to hard center.

U.S. Pat. No. 3,784,209 to Berman, et al. generally discloses a soft-to-hard hardness gradient. The '209 patent discloses a non-homogenous, molded golf ball with a core of "mixed" elastomers. A center sphere of uncured elastomeric material is surrounded by a compatible but different uncured elastomer. When both layers of elastomer are concurrently exposed to a curing agent, they become integral with one another, thereby forming a mixed core. The center of this core, having a higher concentration of the first elastomeric material, is harder than the outer layer. One drawback to this method of manufacture is the time-consuming process of creating first elastomer and then a second elastomer and then molding the two together.

Other patents discuss cores that receive a surface treatment to provide a soft 'skin'. However, since the interior portions of these cores are untreated, they have the similar hard surface to soft center gradient as conventional cores. For example, U.S. Pat. No. 6,113,831 to Nesbitt et al. generally discloses a conventional core and a separate soft skin wrapped around the core. This soft skin is created by exposing the preform slug to steam during the molding process so that a maximum mold temperature exceeds a steam set point, and by controlling exothermic molding temperatures during molding. The skin comprises the radially-outermost $\frac{1}{32}$ inch to $\frac{1}{4}$ inch of the spherical core. U.S. Pat. Nos. 5,976,443 and 5,733,206, both to Nesbitt et al., disclose the addition of water mist to the outside surface of the slug before molding in order to create a soft skin. The water allegedly softens the compression of the core by retarding crosslinking on the core surface, thereby creating an even softer soft skin around the hard central portion.

Additionally, a number of patents disclose multilayer golf ball cores, where each core layer has a different hardness thereby creating a hardness gradient from core layer to core layer. There remains a need, however, for a golf ball incorporating a single layer core having a surface hardness that differs from its center hardness by up to about 10 Shore C, and to achieve a method of producing such a core that is inexpensive and efficient. Such a golf ball would possess unique combinations of compression, "feel," spin and durability. The present invention addresses and solves this need.

SUMMARY OF THE INVENTION

Accordingly, a golf ball of the invention comprises: a core having an outer surface and a geometric center and being formed from a substantially homogenous rubber composition comprising a carbon-carbon initiator; an intermediate layer disposed about the core; and a cover layer disposed about the intermediate layer; wherein the outer surface has a hardness that differs from a hardness at the geometric center by up to about 10 Shore C.

In one embodiment, a golf ball of the invention comprises: a core having an outer surface and a geometric center and being formed from a substantially homogenous rubber composition comprising a carbon-carbon initiator; and a cover layer disposed about the core; wherein the outer surface has a hardness that differs from a hardness at the geometric center by up to about 10 Shore C.

Alternatively, a golf ball of the invention comprises: a core having an outer surface and a geometric center and being formed from a substantially homogenous composition comprising a carbon-carbon initiator; an intermediate layer disposed about the core and comprising an ionomeric material; and a cover layer disposed about the intermediate layer, the cover comprising a castable polyurea or a castable polyurethane; wherein the outer surface has a hardness that differs from a hardness at the geometric center by up to about 10 Shore C.

In yet another embodiment, the golf ball comprises: a core being formed from a substantially homogenous thermoset rubber composition comprising a carbon-carbon initiator, said core having an outer surface and a geometric center; a cover layer disposed about the core, said cover layer comprising an ionomer or a highly-neutralized ionomer;

wherein the outer surface has a hardness that differs from a hardness at the geometric center by up to about 10 Shore C.

In any of these embodiments, the hardness of the outer surface may alternatively be substantially the same as the hardness at the geometric center.

In one embodiment, the hardness of the outer surface differs from the hardness at the geometric center by up to about 8 Shore C. In another embodiment, the hardness of the outer surface differs from the hardness at the geometric center by up to about 5 Shore C. In yet another embodiment, the hardness of the outer surface differs from the hardness at the geometric center by less than about 5 Shore C or by less than about 3 Shore C.

In one embodiment, the outer surface has a hardness that is less than a hardness at the geometric center by up to about 10 Shore C. In another embodiment, the outer surface has a hardness that is less than a hardness at the geometric center by up to about 8 Shore C. In yet another embodiment, the outer surface has a hardness that is less than a hardness at the geometric center by up to about 5 Shore C. In still another embodiment, the outer surface has a hardness that is less than a hardness at the geometric center by about 3 Shore C or lower.

In one embodiment, the outer surface has a hardness that is greater than a hardness at the geometric center by up to about 10 Shore C. In another embodiment, the outer surface has a hardness that is greater than a hardness at the geometric center by up to about 8 Shore C. In yet another embodiment, the outer surface has a hardness that is greater than a hardness at the geometric center by up to about 5 Shore C. In still another embodiment, the outer surface has a hardness that is greater than a hardness at the geometric center by about 3 Shore C or lower.

In one embodiment, the geometric center has a hardness of from about 55 Shore C to about 72 Shore C. In another embodiment, the geometric center has a hardness of from about 60 Shore C to about 68 Shore C. In yet another embodiment, the geometric center has a hardness of from about 65 Shore C to about 75 Shore C. In still another embodiment, the geometric center has a hardness of from about 73 Shore C to about 82 Shore C. In a different embodiment, the geometric center has a hardness of from about 75 Shore C to about 80 Shore C.

In one embodiment, the rubber composition comprises the carbon-carbon initiator in an amount of from about 0.2 phr to about 2.0 phr. In one embodiment, the rubber composition comprises an antioxidant in a ratio of antioxidant to active initiator of about 0.4 or greater.

The core may be molded for about 8 min. to about 16 min. at a cure temperature of greater than 330° F.

In one embodiment, the core has a compression of from about 40 atti to about 100 atti. In another embodiment, the core has a compression of from about 55 atti to about 85 atti. In yet another embodiment, the core has a compression of from about 60 atti to about 70 atti.

The core preferably has a diameter of from about 1.51 inches to about 1.55 inches, but the core may in alternative embodiments have a diameter of about 1.0 inch to about 1.64 inches, or about 1.30 inches to about 1.620, or about 1.40 inches to about 1.60 inches.

A golf ball of the invention may also consist essentially of: a core having an outer surface and a geometric center and being formed from a substantially homogenous rubber composition comprising a carbon-carbon initiator; an intermediate layer disposed about the core; and a cover layer disposed about the intermediate layer; wherein the outer surface has a hardness that differs from a hardness at the geometric center by up to about 10 Shore C.

In one embodiment, a golf ball of the invention consists essentially of: a core having an outer surface and a geometric center and being formed from a substantially homogenous rubber composition comprising a carbon-carbon initiator; and a cover layer disposed about the core; wherein the outer surface has a hardness that differs from a hardness at the geometric center by up to about 10 Shore C.

Alternatively, a golf ball of the invention may consist essentially of: a core having an outer surface and a geometric center and being formed from a substantially homogenous composition comprising a carbon-carbon initiator; an intermediate layer disposed about the core and comprising an ionomeric material; and a cover layer disposed about the intermediate layer, the cover comprising a castable polyurea or a castable polyurethane; wherein the outer surface has a hardness that differs from a hardness at the geometric center by up to about 10 Shore C.

In yet another embodiment, the golf ball consists essentially of: a core being formed from a substantially homogenous thermoset rubber composition comprising a carbon-carbon initiator, said core having an outer surface and a geometric center; a cover layer disposed about the core, said cover layer comprising an ionomer or a highly-neutralized ionomer; wherein the outer surface has a hardness that differs from a hardness at the geometric center by up to about 10 Shore C.

A golf ball of the invention may in a different embodiment consist of: a core having an outer surface and a geometric center and being formed from a substantially homogenous rubber composition comprising a carbon-carbon initiator; an intermediate layer disposed about the core; and a cover layer disposed about the intermediate layer; wherein the outer surface has a hardness that differs from a hardness at the geometric center by up to about 10 Shore C.

In one embodiment, a golf ball of the invention consists of: a core having an outer surface and a geometric center and being formed from a substantially homogenous rubber composition comprising a carbon-carbon initiator; and a cover layer disposed about the core; wherein the outer surface has a hardness that differs from a hardness at the geometric center by up to about 10 Shore C.

Alternatively, a golf ball of the invention may consist of: a core having an outer surface and a geometric center and being formed from a substantially homogenous composition comprising a carbon-carbon initiator; an intermediate layer disposed about the core and comprising an ionomeric material; and a cover layer disposed about the intermediate layer, the cover comprising a castable polyurea or a castable polyurethane; wherein the outer surface has a hardness that differs from a hardness at the geometric center by up to about 10 Shore C.

In yet another embodiment, the golf ball consists of: a core being formed from a substantially homogenous thermoset rubber composition comprising a carbon-carbon initiator, said core having an outer surface and a geometric center; a cover layer disposed about the core, said cover layer comprising an ionomer or a highly-neutralized ionomer; wherein the outer surface has a hardness that differs from a hardness at the geometric center by up to about 10 Shore C.

The present invention is directed to golf balls containing cores having an outer surface and a center that are formed from a substantially homogenous rubber composition. An intermediate layer, such as a casing layer, is disposed about the core, and a cover layer is formed around the intermediate layer, the cover typically including a castable polyurea, castable polyurethane, or a hybrid thereof. The outer surface of the core may have a trans-polybutadiene content of about 6% to 10%, the center of the core has a trans-polybutadiene content of about 1% to 3%, and the trans content of the outer surface of the core is greater than the trans content of the center by about 6% or greater to define a positive trans gradient along the core radius.

In one embodiment, the hardness of the outer surface of the core may be lower than a hardness of the geometric center to define a negative hardness gradient of about −1 to about −10, or about −5 to −10. The outer surface of the core may have a hardness of about 68 to about 80 Shore C and the geometric center has a hardness of about 68 to 80 Shore C. A hardness measured at the outer surface of the core may also be greater than a hardness of the core center to define a positive hardness gradient of about 0 to 5, more preferably about 2 to 5.

A cover layer, which may include more than one layer, is formed over the core or intermediate layer and typically includes a castable polyurea or a castable polyurethane, or a hybrid of both.

The invention is also directed to a method of making a golf ball comprising: forming a core from a substantially homogenous rubber composition comprising a carbon-carbon initiator wherein the core has a geometric center and an outer surface and the outer surface has a hardness that is different than a hardness of the geometric center by up to about 10 Shore C; forming an intermediate layer about the core; and forming a cover about the intermediate layer.

In one embodiment, the method comprises: forming a core from a substantially homogenous rubber composition comprising a carbon-carbon initiator wherein the core has a geometric center and an outer surface and the outer surface has a hardness that is different than a hardness of the geometric center by up to about 10 Shore C; and forming a cover about the core.

The invention is also directed to a method of making a golf ball comprising: forming a core from a substantially homogenous rubber composition comprising a carbon-carbon initiator and curing the core composition for about 8 mins. to about 16 mins. at a temperature of greater than 330° F., wherein the core has a geometric center and an outer surface and the outer surface has a hardness that is different than a hardness of the geometric center by up to about 10 Shore C; and forming a cover about the core.

The invention is alternatively directed to a method of making a golf ball consisting essentially of: forming a core from a substantially homogenous rubber composition comprising a carbon-carbon initiator wherein the core has a geometric center and an outer surface and the outer surface has a hardness that is different than a hardness of the geometric center by up to about 10 Shore C; forming an intermediate layer about the core; and forming a cover about the intermediate layer.

In one embodiment, the method consists essentially of: forming a core from a substantially homogenous rubber composition comprising a carbon-carbon initiator wherein the core has a geometric center and an outer surface and the outer surface has a hardness that is different than a hardness of the geometric center by up to about 10 Shore C; and forming a cover about the core.

The invention is also directed to a method of making a golf ball consisting essentially of: forming a core from a substantially homogeneous rubber composition comprising a carbon-carbon initiator and curing the core composition for about 8 mins. to about 16 mins. at a temperature of greater than 330° F., wherein the core has a geometric center and an outer surface and the outer surface has a hardness that is different than a hardness of the geometric center by up to about 10 Shore C; and forming a cover about the core.

The invention is alternatively directed to a method of making a golf ball consisting of: forming a core from a substantially homogenous rubber composition comprising a carbon-carbon initiator wherein the core has a geometric center and an outer surface and the outer surface has a hardness that is different than a hardness of the geometric center by up to about 10 Shore C; forming an intermediate layer about the core; and forming a cover about the intermediate layer.

In one embodiment, the method consists of: forming a core from a substantially homogenous rubber composition comprising a carbon-carbon initiator wherein the core has a geometric center and an outer surface and the outer surface has a hardness that is different than a hardness of the geometric center by up to about 10 Shore C; and forming a cover about the core.

The invention is also directed to a method of making a golf ball consisting of: forming a core from a substantially homogenous rubber composition comprising a carbon-carbon initiator and curing the core composition for about 8 mins. to about 16 mins. at a temperature of greater than 330° F., wherein the core has a geometric center and an outer surface and the outer surface has a hardness that is different than a hardness of the geometric center by up to about 10 Shore C; and forming a cover about the core.

In one embodiment of a method of the invention, a golf ball is formed comprising a core having a surface hardness that is less than the hardness of the geometric center by up to about 10 Shore C. In yet another embodiment, a golf ball is formed comprising a core having a surface hardness that is less than the hardness of the geometric center by up to about 8 Shore C. In still another embodiment, a golf ball is formed comprising a core having a surface hardness that is less than the hardness of the geometric center by up to about 5 Shore C. In an alternative embodiment, a golf ball is formed comprising a core having a surface hardness that is less than the hardness of the geometric center by up to about 3 Shore C. The method of the invention may form a golf ball is formed comprising a core having a surface hardness that is less than the hardness of the geometric center by from about 1 Shore C to about 3 Shore C.

In another embodiment of a method of the invention, a golf ball is formed comprising a core having a surface hardness that is greater than the hardness of the geometric center by up to about 10 Shore C. In yet another embodiment, a golf ball is formed comprising a core having a surface hardness that is greater than the hardness of the geometric center by up to about 8 Shore C. In still another embodiment, a golf ball is formed comprising a core having a surface hardness that is greater than the hardness of the geometric center by up to about 5 Shore C. In an alternative embodiment, a golf ball is formed comprising a core having a surface hardness that is greater than the hardness of the geometric center by up to about 3 Shore C.

The method of the invention for making a golf ball may in a different embodiment form a golf ball comprising a core having a surface hardness that is substantially similar to the hardness of the geometric center.

DETAILED DESCRIPTION OF THE INVENTION

As used herein, the term "carbon-carbon free radical initiators" or "C—C initiators" refers to free radical initiators that are thermally decomposable into free radicals by breaking one or more elongated and therefore weakened carbon-carbon single bonds. These C—C initiators and their subgroups are also known, among others, as C—C labile compounds, organic compounds having unstable or labile C—C bonds, pure hydrocarbon initiators, aromatic hydrocarbons, highly branched alkanes, sterically-crowded phenyl-substituted alkanes, bibenzyl or diphenyl curing catalysts, dicumyl compounds or synergists, alkyl-substituted diphenyl compounds, substituted succinates, diphenylethane derivatives, pinacoles or pinacolones and derivatives thereof, silylbenzopinacoles and derivatives thereof, non-peroxide free radical initiators, oxygen-free radical donors or activators, carbon radical donors, carbon radical activators, carbon radical promoters, or carbon radical generators.

Unlike the peroxide initiators, C—C initiators have chemical structures that are free of peroxide groups. Rather, the C—C initiators have at least one carbon-carbon single bond that is elongated by suitable neighboring moieties, rendering the bond weakened and labile (i.e., unstable). When heated, the C—C initiators decompose and give rise to carbon-based free radicals by splitting along these elongated and labile carbon-carbon single bonds, which are typically at least about 0.155 nm in length. The C—C initiators are substantially void of the disadvantages associated with peroxides in crosslinking polyolefins such as polybutadiene as mentioned above, or at least display these disadvantages to a reduced extent. The C—C initiators are capable of splitting the labile C—C bond(s) in a temperature range of about 150° C. to about 300° C. The half-life values of these C—C initiators in the temperature range preferred for crosslinking, i.e. about 150° C. to 300° C., is between about 10 hours and about 0.1 hours. Because of their long half-lives at the low end of the operating temperature range, i.e. about 160° C., the C—C initiators can be well mixed into the polymer during the heat-melting phase while remaining in an effective amount, without undergoing noticeable premature decomposition and subsequent initiation of crosslinking of the base polymer. The C—C initiators become markedly more active at temperatures above 190° C.; but even at such a high temperature, thorough mixing of the C—C initiator into the base polymer proceeds well without noticeable premature crosslinking, which can be detected by an increase in the resistance to kneading. High stability at high temperatures make these C—C initiators very attractive both as thermal initiators and as crosslinking agents for polybutadiene-based golf ball cores or layers.

Also because of their high decomposition temperatures, the C—C initiators have high modification efficiency. They do not attack the base polymers prematurely or vigorously, therefore do not cause premature crosslinking or gelation. Because these C—C initiators are free of oxygen radicals, they reduce the occurrence of oxidation, decomposition, outgassing, and discoloration in the base polymer. Other advantageous impact of the C—C initiators on the base polymer include enhanced adhesion and moldability, reduced changes in melt flow rate, and narrowed molecular weight distribution (i.e., lowered polydispersity).

Suitable C—C initiators for the present invention include pure hydrocarbon initiators (aliphatic, alicyclic, or aromatic); substituted C—C initiators having any number of moieties such as halogen (fluorine, chlorine, bromine, or iodide), alkyl, alkoxy, aryl (such as phenyl, naphthyl, 5- or 6-membered heterocyclic rings with a π-electron system and N, O, or S as heteroatoms), aryloxy, cycloalkyl, substituted cycloalkyl, vinyl, substituted phenyl, cyano, nitro, nitrile, hydroxyl, amino, carboxyl, ester, amide, thio, epoxide, silyl, or silyloxy groups; and oligomeric C—C initiators. Pure hydrocarbon initiators are preferred because they are fully compatible with the base polymers to be crosslinked, and are capable of being added at any stage at any amount. In addition, these pure hydrocarbon initiators are not very volatile, odorless, easy to handle, and cause no storage problems.

One group of C—C initiators shares the following structure:

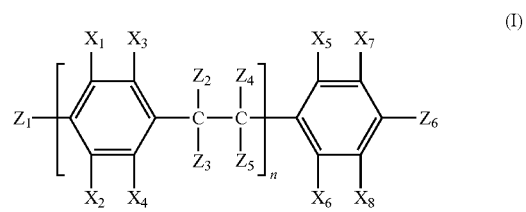

where n is an integer from 1 to about 10; $Z_1$ to $Z_6$ are independently selected from hydrogen, halogen, linear or branched alkyl, alkoxy, aryl (such as phenyl, naphthyl, 5- or 6-membered heterocyclic rings with a π-electron system and N, O, or S as heteroatoms), aryloxy, cycloalkyl, substituted cycloalkyl, vinyl, substituted phenyl, cyano, nitro, nitrile, hydroxyl, amino, carboxyl, ester, amide, thio, epoxide, silyl, or silyloxy groups; and $X_1$ to $X_8$ are independently selected from hydrogen, halogen, linear or branched alkyl, alkoxy, cyano, nitro, nitrile, hydroxyl, or amino groups. Each of $X_1$ to $X_8$ and $Z_1$ to $Z_6$ preferably has no more than about 20 carbon atoms, more preferably less than about 8 carbon atoms, and most preferably less than about 6 carbon atoms. Among these carbon-carbon initiators, 2,3-dimethyl-2,3-diphenylbutane, 3,4-dimethyl-3,4-diphenylhexane, poly(1,4-diisopropylbenzene), and combinations thereof are most preferred.

For example, when n is 1, $Z_1$, $Z_6$, and $X_1$ to $X_8$ are all hydrogen, and $Z_2$ to $Z_5$, are all methyl, the C—C initiator of (I) becomes 2,3-dimethyl-2,3-diphenylbutane (CAS#1889-67-4) with the following chemical structure:

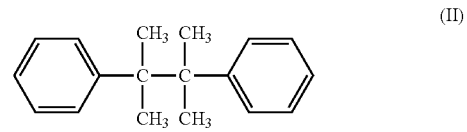 [SMILES: CC(C)(c1ccccc1)C(C)(C)c1ccccc1]

Another group of C—C initiators has the following formula:

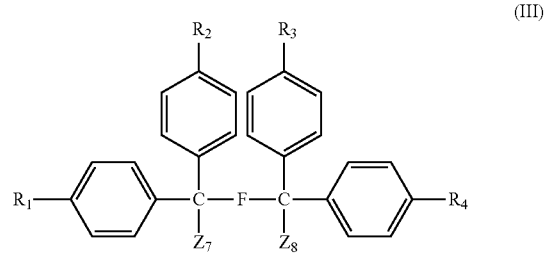

where R is substituted hydrocarbon moiety, $R_1$ to $R_4$ are independently selected from hydrogen, alkyl, or alkoxy groups, and $Z_7$ and $Z_8$ are independently selected from hydrogen, halogen, linear or branched alkyl, alkoxy, aryl (such as phenyl, naphthyl, 5- or 6-membered heterocyclic rings with a π-electron system and N, O, or S as heteroatoms), aryloxy, cycloalkyl, substituted cycloalkyl, vinyl, substituted phenyl, cyano, nitro, nitrile, hydroxyl, amino, carboxyl, ester, amide, thio, epoxide, silyl, or silyloxy groups. Preferably, each of $R_1$ to $R_4$ and $Z_7$ to $Z_8$ has no more than about 20 carbon atoms. An exemplary C—C initiator of the formula (III) is 3-methoxycarbonyl-3-methyl-2,2,5,5-tetraphenylhexandinitrile.

Examples of C—C initiators include: bibenzyl; α,α'-dimethoxybibenzyl; α,α'-dimethoxy-α,α'-dimethylbibenzyl; α-methoxy-α,α'-diphenylbibenzyl; α,α'-dimethoxy-α,α'-diphenylbibenzyl; 1,2-dinitro-1,2-diphenylethane; 1,2-dinitro-1,2-di(p-tolyl)ethane; 1,2-dichloro-1,2-diphenylethane; 1,2-dibromo-1,2-diphenylethane; 1,2-dibromo-1,2-dimethyl-1,2-diphenylethane; tetraphenylethane; hexaphenylethane; tetrabromodiphenylethane; pentabromodiphenylethane; hexabromodiphenylethane; heptabromodiphenylethane; octabromodiphenylethane; novabromodiphenylethane; decabromodiphenylethane; 1,2-bis(trimethylsiloxy)-1,2-diphenylethane; 1,2-diphenyl-1,2-ethanediol (i.e.; hydrobenzoin); 1,1,2,2-tetraphenyl-1,2-ethanediol (i.e.; benzopinacol or tetraphenylethylene glycol); 2,3-dimethyl-2,3-butanediol (i.e.; pinacol; pinacone; or tetramethylethylene glycol); 2,3-diphenyl-2,3-butanediol; 3,4-diphenyl-3,4-hexanediol; 1,2-bis(trimethylsiloxy)-1,1,2,2-tetraphenylethane; 2,3-bis(trimethylsilyloxy)-2,3-diphenylbutane; 2,3-bis(trimethylsilyloxy)-2,2,3,3-tetraphenylbutane; 2,3-diethyl-2,3-diphenylsuccinonitrile (i.e.; diethyl-2,3-dicyano-2,3-diphenylsuccinate); 2,2,3,3-tetraphenylsuccinonitrile; 2,3-dimethylbutane; 2,3-diphenylbutane; 2-methyl-2,3-diphenylbutane; 2,3-dimethyl-1,1-diphenylbutane; 2,3-dimethyl-1,2-diphenylbutane; 2,3-dimethyl-1,4-diphenylbutane; 2,3-dimethyl-2,3-diphenylbutane; 2,3-diethyl-2,3-diphenylbutane; 2-methyl-3-ethyl-2,3-diphenylbutane; 2,3-dipropyl-2,3-diphenylbutane; 2,3-dibutyl-2,3-diphenylbutane; 2,3-diisobutyl-2,3-diphenylbutane; 2,3-dihexyl-2,3-diphenylbutane; 2-methyl-2-phenyl-3-tolylbutane; 2-methyl-3-phenyl-2-tolylbutane; 2-benzyl-3-methyl-1-phenylbutane; 2,2,3,3-tetraphenylbutane; 2,3-dimethyl-2,3-di(p-methylphenyl)butane; 2,3-diethyl-2,3-di(p-methylphenyl)butane; 2,3-dimethyl-2,3-di(p-tolyl)butane; 2,3-dimethyl-2,3-di[p-(t-butyl)phenyl]butane; 1,4-bis(1-bora-3,4-diphenylcyclopentyl)-2,3-diphenylbutane; 2,3-dimethyl-2-methylphenyl-3-[(p-2',3'-dimethyl-3'-methylphenyl-butyl)phenyl]butane; 2,3-dimethyl-2,3-di(p-isopropylphenyl)butane; 2,3-dimethyl-2,3-di(p-benzylphenyl)butane; 2,3-dimethyl-2,3-di(2,3,4,5,6-pentamethylphenyl)butane; 2,3-dimethyl-2,3-di(m-hexadecylphenyl)butane; 2,3-dimethyl-2,3-di(p-eicosylphenyl)butane; 2-methyl-3-isopropyl-2,3-di(p-isobutylphenyl)butane; 2,3-dicyano-2,3-diphenylbutane; 2,3-dimethyl-2,3-di(p-methoxyphenyl)butane; 2,3-dimethyl-2,3-di(p-ethoxyphenyl)butane; 2,3-dimethyl-2,3-di(p-chlorophenyl)butane; 2,3-dimethyl-2,3-di(p-bromophenyl)butane; 2,3-dimethyl-2,3-di(p-iodophenyl)butane; 2,3-dimethyl-2,3-di(p-nitrophenyl)butane; 2,3-diethyl-2,3-di(p-chlorophenyl)butane; 2,3-diethyl-2,3-di(p-bromophenyl)butane; 2,3-diethyl-2,3-di(p-iodophenyl)butane; 2,3-diethyl-2,3-di(p-nitrophenyl)butane; 2-methyl-1,1-diphenylpentane; 4-methyl-1,1-diphenylpentane; 2-methyl-1,2-diphenylpentane; 4-methyl-1,2-diphenylpentane; 2-methyl-1,3-diphenylpentane; 4-methyl-1,3-diphenylpentane; 2-methyl-1,4-diphenylpentane; 2-methyl-1,5-diphenylpentane; 4-methyl-2,2-diphenylpentane; 2-methyl-2,3-diphenylpentane; 2-methyl-2,4-diphenylpentane; 2-methyl-3,4-diphenylpentane; 2-methyl-2,5-diphenylpentane; 2-methyl-3,3-diphenylpentane; 3,4-dimethylhexane; 3,4-dimethyl-3,4-diethylhexane; 1,1-diphenylhexane; 1,2-diphenylhexane (i.e.; 2-benzyl-1-phenylpentane); 1,3-diphenylhexane; 1,4-diphenylhexane; 1,5-diphenylhexane; 1,6-diphenylhexane; 2,2-diphenylhexane; 2,3-diphenylhexane; 2,4-diphenylhexane; 2,5-diphenylhexane; 3,3-diphenylhexane; 3,4-diphenylhexane; 2,3-dimethyl-2,3-diphenylhexane; 3,4-dimethyl-3,4-diphenylhexane; 3,4-diethyl-3,4-diphenylhexane; 3,4-dipropyl-3,4-diphenylhexane; 3,4-diisobutyl-3,4-diphenylhexane; 3,3,4,4-tetraphenylhexane; 3,4-diethyl-3,4-di(3,4,5-triethylphenyl)hexane; 4,5-dimethyl-4,5-diphenyloctane; 4,5-dipropyl-4,5-diphenyloctane; 5,6-dimethyl-5,6-diphenyldecane; 5,6-dimethyl-5,6-di(p-cyclohexylphenyl)decane; 6,7-dimethyl-6,7-diphenyldodecane; 7,8-dimethyl-7,8-di(p-methoxyphenyl)tetradecane; 1,1'-diphenyl-1,1'-bicyclopentyl; 1,1'-diphenyl-1,1'-bicyclohexyl; poly(1,4-diisopropylbenzene); and poly(1,3-diisopropylbenzene). Other C—C initiators useful in the present invention include substituted succinates, silylpinacolone ethers, 1,2-diphenylethane derivatives as disclosed in U.S. Pat. No. 4,556,695, pinacol or pinacolone and derivatives thereof as disclosed in U.S. Pat. Nos. 4,117,017 and 4,135,047, and silylbenzopinacoles as disclosed in U.S. Pat. No. 4,948,820. These patents are incorporated herein by reference in their entirety.

Any of the C—C initiators as disclosed herein may be used solely or in combinations of two or more. Preferred commercially available C—C initiators for the present invention include 2,3-dimethyl-2,3-diphenylbutane (CAS#1889-67-4, from Akzo Nobel under the tradename of Perkadox® 30, from United Initiators under the brand name of CCDFB-90, and from Nippon Oil & Fat Corporation under the tradename of Nofiner® BC); 3,4-dimethyl-3,4-diphenylhexane (CAS#10192-93-5, from United Initiators under the brand name of CCDFH); poly(1,4-diisopropylbenzene) (CAS#100-18-5, from United Initiators under the brand name of CCPIB); and combinations thereof.

Suitable carbon-carbon initiators for the present invention include, but are not limited to, aliphatic hydrocarbon initiators, alicyclic hydrocarbon initiators, aromatic hydrocarbon initiators, substituted carbon-carbon initiators, and oligomeric carbon-carbon initiators. Most preferred are hydrocarbon initiators that are compatible with the base polymer.

The base polymer can be any polymers suitable for golf ball application, for example, at least one polybutadiene having a Mooney viscosity of about 20 to about 150. The carbon-carbon initiator may be present in an amount of from about 0.01 phr to about 15.0 phr by weight of the base polymer, or from about 0.1 phr to about 10.0 phr by weight of the base polymer, or from about 0.1 phr to about 5.0 phr by weight of the base polymer, or from about 0.2 phr to about 2.0 phr by weight of the base polymer.

The weight ratio of the carbon-carbon initiator to the crosslinking agent may be from about 0.01:1 to about 5:1. The preferred weight ratio of the carbon-carbon initiator to peroxide initiator may be about 0.05:1 to about 50:1. The peroxide initiator preferably has a decomposition temperature lower than that of the carbon-carbon initiator.

The golf balls of the present invention may include a single-layer (one-piece) golf ball, and multi-layer golf balls, such as one having a core and a cover surrounding the core, but are preferably formed from a core comprised of a solid center (otherwise known as an inner core) and an intermediate layer, and an outer cover layer. Of course, any of the core and/or the cover layers may include more than one layer. In one embodiment, the core and intermediate layer have a "soft-to-hard" hardness gradient (a "negative" hardness gradient) radially inward from each component's outer surface towards its innermost portion (i.e., the center of the core or the inner surface of the intermediate layer), although alternative embodiments involving varying direction and combination of hardness gradient amongst components are also envisioned (e.g., a "negative" gradient in the center coupled with a "positive" gradient in the intermediate layer, or vice versa). In one embodiment, the intermediate layer in optional.

The core may also be a liquid-filled or hollow sphere surrounded by one or more intermediate and/or cover layers, or it may include a solid or liquid center around which tensioned elastomeric material is wound. Any layers disposed around these alternative centers may exhibit the inventive core hardness gradient (i.e., "negative"). The cover layer may be a single layer or, for example, formed of a plurality of layers, such as an inner cover layer and an outer cover layer.

As briefly discussed above, the inventive cores may have a hardness gradient defined by hardness measurements made at the surface of the inner core (or outer core layer) and radially inward towards the center of the inner core, typically at 2-mm increments. As used herein, the terms "negative" and "positive" refer to the result of subtracting the hardness value at the innermost portion of the component being measured (e.g., the center of a solid core or an inner core in a dual core construction; the inner surface of a core layer; etc.) from the hardness value at the outer surface of the component being measured (e.g., the outer surface of a solid core; the outer surface of an inner core in a dual core; the outer surface of an outer core layer in a dual core, etc.). For example, if the outer surface of a solid core has a lower hardness value than the center (i.e., the surface is softer than the center), the hardness gradient will be deemed a "negative" gradient (a smaller number–a larger number=a negative number). It is preferred that the inventive cores have a zero or a negative hardness gradient, more preferably between zero (0) and −10, most preferably between 0 and −5.

Preferably, the core layers (inner core or outer core layer) is made from a composition including at least one thermoset base rubber, such as a polybutadiene rubber, cured with at least one peroxide and at least one reactive co-agent, which can be a metal salt of an unsaturated carboxylic acid, such as acrylic acid or methacrylic acid, a non-metallic coagent, or mixtures thereof. Preferably, a suitable antioxidant is included in the composition. An optional soft and fast agent (and sometimes a cis-to-trans catalyst), such as an organosulfur or metal-containing organosulfur compound, can also be included in the core formulation Other ingredients that are known to those skilled in the art may be used, and are understood to include, but not be limited to, density-adjusting fillers, process aides, plasticizers, blowing or foaming agents, sulfur accelerators, and/or non-peroxide radical sources.

The base thermoset rubber, 130 which can be blended with other rubbers and polymers, typically includes a natural or synthetic rubber. A preferred base rubber is 1,4-polybutadiene having a cis structure of at least 40%, preferably greater than 80%, and more preferably greater than 90%. Examples of desirable polybutadiene rubbers include BUNA® CB22 and BUNA® CB23, commercially available from LANXESS Corporation; UBEPOL® 360L and UBEPOL® 150L and UBEPOL-BR rubbers, commercially available from UBE Industries, Ltd. of Tokyo, Japan; KINEX® 7245 and KINEX® 7265, commercially available from Goodyear of Akron, Ohio; SE BR-1220, and TAKTENE® 1203G1, 220, and 221, commercially available from Dow Chemical Company; Europrene® NEOCIS® BR 40 and BR 60, commercially available from Polimeri Europa; and BR 01, BR 730, BR 735, BR 11, and BR 51, commercially available from Japan Synthetic Rubber Co., Ltd; PETROFLEX® BRNd-40; and KARBOCHEM® ND40, ND45, and ND60, commercially available from Karbochem.

The base rubber may also comprise high or medium Mooney viscosity rubber, or blends thereof. A "Mooney" unit is a unit used to measure the plasticity of raw or unvulcanized rubber. The plasticity in a "Mooney" unit is equal to the torque, measured on an arbitrary scale, on a disk in a vessel that contains rubber at a temperature of 100° C. and rotates at two revolutions per minute. The measurement of Mooney viscosity is defined according to ASTM D-1646. The Mooney viscosity range is preferably greater than about 40, more preferably in the range from about 40 to about 80 and more preferably in the range from about 40 to about 60. Polybutadiene rubber with higher Mooney viscosity may also be used, so long as the viscosity of the polybutadiene does not reach a level where the high viscosity polybutadiene clogs or otherwise adversely interferes with the manufacturing machinery. It is contemplated that polybutadiene with viscosity less than 65 Mooney can be used with the present invention. Gin one embodiment of the present invention, golf ball cores made with mid- to high-Mooney viscosity polybutadiene material exhibit increased resiliency (and, therefore, distance) without increasing the hardness of the ball. Such cores are soft, i.e., compression less than about 60 and more specifically in the range of about 50-55. Cores with compression in the range of from about 30 about 50 are also within the range of this preferred embodiment.

Commercial sources of suitable mid- to high-Mooney viscosity polybutadiene include Bayer AG CB23 (Nd-catalyzed), which has a Mooney viscosity of around 50 and is a highly linear polybutadiene, and Shell 1220 (Co-catalyzed). If desired, the polybutadiene can also be mixed with other elastomers known in the art, such as other polybutadiene rubbers, natural rubber, styrene butadiene rubber, and/or isoprene rubber in order to further modify the properties of the core. When a mixture of elastomers is used, the amounts of other constituents in the core composition are typically based on 100 parts by weight of the total elastomer mixture. In one preferred embodiment, the base rubber comprises a Nd-catalyzed polybutadiene, a rare earth-catalyzed polybutadiene rubber, or blends thereof. If desired, the polybutadiene can also be mixed with other elastomers known in the art such as natural rubber, polyisoprene rubber and/or styrene-butadiene rubber in order to modify the properties of the core. Other suitable base rubbers include thermosetting materials such as, ethylene propylene diene monomer rubber, ethylene propylene rubber, butyl rubber, halobutyl rubber, hydrogenated nitrile butadiene rubber, nitrile rubber, and silicone rubber.

Thermoplastic elastomers (TPE) many also be used to modify the properties of the core layers, or the uncured core layer stock by blending with the base thermoset rubber. These TPEs include natural or synthetic balata, or high trans-polyisoprene, high trans-polybutadiene, or any styrenic block copolymer, such as styrene ethylene butadiene styrene, styrene-isoprene-styrene, etc., a metallocene or other single-site catalyzed polyolefin such as ethylene-octene, or ethylene-butene, or thermoplastic polyurethanes (TPU), including copolymers, e.g. with silicone. Other suitable TPEs for blending with the thermoset rubbers of the present invention include PEBAX®, which is believed to comprise polyether amide copolymers, HYTREL®, which is believed to comprise polyether ester copolymers, thermoplastic urethane, and KRATON®, which is believed to comprise styrenic block copolymers elastomers. Any of the TPEs or TPUs above may also contain functionality suitable for grafting, including maleic acid or maleic anhydride.

Additional polymers may also optionally be incorporated into the base rubber. Examples include, but are not limited to, thermoset elastomers such as core regrind, thermoplastic vulcanizate, copolymeric ionomer, terpolymeric ionomer, polycarbonate, polyamide, copolymeric polyamide, polyesters, polyvinyl alcohols, acrylonitrile-butadiene-styrene copolymers, polyarylate, polyacrylate, polyphenylene ether, impact-modified polyphenylene ether, high impact polystyrene, diallyl phthalate polymer, styrene-acrylonitrile polymer (SAN) (including olefin-modified SAN and acrylonitrile-styrene-acrylonitrile polymer), styrene-maleic anhydride copolymer, styrenic copolymer, functionalized styrenic copolymer, functionalized styrenic terpolymer, styrenic terpolymer, cellulose polymer, liquid crystal polymer, ethylene-vinyl acetate copolymers, polyurea, and polysiloxane or any metallocene-catalyzed polymers of these species.

Suitable polyamides for use as an additional polymeric material in compositions within the scope of the present invention also include resins obtained by: (1) polycondensation of (a) a dicarboxylic acid, such as oxalic acid, adipic acid, sebacic acid, terephthalic acid, isophthalic acid, or 1,4-cyclohexanedicarboxylic acid, with (b) a diamine, such as ethylenediamine, tetramethylenediamine, pentamethylenediamine, hexamethylenediamine, or decamethylenediamine, 1,4-cyclohexanediamine, or m-xylylenediamine; (2) a ring-opening polymerization of cyclic lactam, such as ε-caprolactam or Ω-laurolactam; (3) polycondensation of an aminocarboxylic acid, such as 6-aminocaproic acid, 9-aminononanoic acid, 11-aminoundecanoic acid, or 12-aminododecanoic acid; or (4) copolymerization of a cyclic lactam with a dicarboxylic acid and a diamine. Specific examples of suitable polyamides include NYLON 6, NYLON 66, NYLON 610, NYLON 11, NYLON 12, copolymerized NYLON, NYLON MXD6, and NYLON 46.

Suitable peroxide initiating agents include dicumyl peroxide; 2,5-dimethyl-2,5-di(t-butylperoxy) hexane; 2,5-dimethyl-2,5-di(t-butylperoxy)hexyne; 2,5-dimethyl-2,5-di(benzoylperoxy)hexane; 2,2'-bis(t-butylperoxy)-di-isopropylbenzene; 1,1-bis(t-butylperoxy)-3,3,5-trimethyl cyclohexane; n-butyl 4,4-bis(t-butyl-peroxy)valerate; t-butyl perbenzoate; benzoyl peroxide; n-butyl 4,4'-bis(butylperoxy) valerate; di-t-butyl peroxide; or 2,5-di-(t-butylperoxy)-2,5-dimethyl hexane, lauryl peroxide, t-butyl hydroperoxide, α-αbis(t-butylperoxy) diisopropylbenzene, di(2-t-butyl-peroxyisopropyl)benzene, di-t-amyl peroxide, di-t-butyl peroxide. Preferably, the rubber composition includes from about 0.25 to about 5.0 parts by weight peroxide per 100 parts by weight rubber (phr), more preferably 0.5 phr to 3 phr, most preferably 0.5 phr to 1.5 phr. In a most preferred embodiment, the peroxide is present in an amount of about 0.8 phr. These ranges of peroxide are given assuming the peroxide is 100% active, without accounting for any carrier that might be present. Because many commercially available peroxides are sold along with a carrier compound, the actual amount of active peroxide present must be calculated. Commercially-available peroxide initiating agents include DICUP™ family of dicumyl peroxides (including DICUP™ R, DICUP™ 40C and DICUP™ 40KE) available from Crompton (Geo Specialty Chemicals). Similar initiating agents are available from AkroChem, Lanxess, Flexsys/Harwick and R.T. Vanderbilt. Another commercially-available and preferred initiating agent is TRIGONOX™ 265-50B from Akzo Nobel, which is a mixture of 1,1-di(t-butylperoxy)-3,3,5-trimethylcyclohexane and di(2-t-butylperoxyisopropyl) benzene. TRIGONOX™ peroxides are generally sold on a carrier compound.

Suitable reactive co-agents include, but are not limited to, metal salts of diacrylates, dimethacrylates, and monomethacrylates suitable for use in this invention include those wherein the metal is zinc, magnesium, calcium, barium, tin, aluminum, lithium, sodium, potassium, iron, zirconium, and bismuth. Zinc diacrylate (ZDA) is preferred, but the present invention is not limited thereto. ZDA provides golf balls with a high initial velocity. The ZDA can be of various grades of purity. For the purposes of this invention, the lower the quantity of zinc stearate present in the ZDA the higher the ZDA purity. ZDA containing less than about 10% zinc stearate is preferable. More preferable is ZDA containing about 4-8% zinc stearate. Suitable, commercially available zinc diacrylates include those from Sartomer Co. The preferred concentrations of ZDA that can be used are about 10 phr to about 40 phr, more preferably 20 phr to about 35 phr, most preferably 25 phr to about 35 phr. In a particularly preferred embodiment, the reactive co-agent is present in an amount of about 29 phr to about 31 phr.

Additional preferred co-agents that may be used alone or in combination with those mentioned above include, but are not limited to, trimethylolpropane trimethacrylate, trimethylolpropane triacrylate, and the like. It is understood by those skilled in the art, that in the case where these co-agents may be liquids at room temperature, it may be advantageous to disperse these compounds on a suitable carrier to promote ease of incorporation in the rubber mixture.

Antioxidants are compounds that inhibit or prevent the oxidative breakdown of elastomers, and/or inhibit or prevent reactions that are promoted by oxygen radicals. Some exemplary antioxidants that may be used in the present invention include, but are not limited to, quinoline type antioxidants, amine type antioxidants, and phenolic type antioxidants. A preferred antioxidant is 2,2'-methylene-bis-(4-methyl-6-t-butylphenol) available as VANOX® MBPC from R.T. Vanderbilt. Other polyphenolic antioxidants include VANOX® T, VANOX® L, VANOX® SKT, VANOX® SWP, VANOX® 13 and VANOX® 1290.

Suitable antioxidants include, but are not limited to, alkylene-bis-alkyl substituted cresols, such as 4,4'-methylene-bis (2,5-xylenol); 4,4'-ethylidene-bis-(6-ethyl-m-cresol); 4,4'-butylidene-bis-(6-t-butyl-m-cresol); 4,4'-decylidene-bis-(6-methyl-m-cresol); 4,4'-methylene-bis-(2-amyl-m-cresol); 4,4'-propylidene-bis-(5-hexyl-m-cresol); 3,3'-decylidene-bis-(5-ethyl-p-cresol); 2,2'-butylidene-bis-(3-n-hexyl-p-cresol); 4,4'-(2-butylidene)-bis-(6-t-butyl-m-cresol); 3,3'-4 (decylidene)-bis-(5-ethyl-p-cresol); (2,5-dimethyl-4-hydroxyphenyl) (2-hydroxy-3,5-dimethylphenyl) methane; (2-methyl-4-hydroxy-5-ethylphenyl) (2-ethyl-3-hydroxy-5-methylphenyl) methane; (3-methyl-5-hydroxy-6-t-butylphenyl) (2-hydroxy-4-methyl-5-decylphenyl)-n-butyl methane; (2-hydroxy-4-ethyl-5-methylphenyl) (2-decyl-3-hydroxy-4-methylphenyl)butylamylmethane; (3-ethyl-4-methyl-5-hydroxyphenyl)-(2,3-dimethyl-3-hydroxy-phenyl)nonyl-methane; (3-methyl-2-hydroxy-6-ethylphenyl)-(2-isopropyl-3-hydroxy-5-methyl-phenyl)cyclohexylmethane; (2-methyl-4-hydroxy-5-methylphenyl) (2-hydroxy-3-methyl-5-ethylphenyl)dicyclohexyl methane; and the like.

Other suitable antioxidants include, but are not limited to, substituted phenols, such as 2-tert-butyl-4-methoxyphenol; 3-tert-butyl-4-methoxyphenol; 3-tert-octyl-4-methoxyphenol; 2-methyl-4-methoxyphenol; 2-stearyl-4-n-butoxyphenol; 3-t-butyl-4-stearyloxyphenol; 3-lauryl-4-ethoxyphenol; 2,5-di-t-butyl-4-methoxyphenol; 2-methyl-4-methoxyphenol; 2-(1-methylcyclohexyl)-4-methoxyphenol; 2-t-butyl-4-dodecyloxyphenol; 2-(1-methylbenzyl)-4-methoxyphenol; 2-t-octyl-4-methoxyphenol; methyl gallate; n-propyl gallate; n-butyl gallate; lauryl gallate; myristyl gallate; stearyl gallate; 2,4,5-trihydroxyacetophenone; 2,4,5-trihydroxy-n-butyrophenone; 2,4,5-trihydroxystearophenone; 2,6-ditert-butyl-4-methylphenol; 2,6-ditert-octyl-4-methylphenol; 2,6-ditert-butyl-4-stearylphenol; 2-methyl-4-methyl-6-tert-butylphenol; 2,6-distearyl-4-methylphenol; 2,6-dilauryl-4-methylphenol; 2,6-di(n-octyl)-4-methylphenol; 2,6-di(n-hexadecyl)-4-methylphenol; 2,6-di(1-methylundecyl)-4-methylphenol; 2,6-di(1-methylheptadecyl)-4-methylphenol; 2,6-di(trimethylhexyl)-4-methylphenol; 2,6-di(1,1,3,3-tetramethyloctyl)-4-methylphenol; 2-n-dodecyl-6-tert butyl-4-methylphenol; 2-n-dodecyl-6-(1-methylundecyl)-4-methylphenol; 2-n-dodecyl-6-(1,1,3,3-tetramethyloctyl)-4-methylphenol; 2-n-dodecyl-6-n-octadecyl-4-methylphenol; 2-n-dodecyl-6-n-octyl-4-methylphenol; 2-methyl-6-n-octadecyl-4-methylphenol; 2-n-dodecyl-6-(1-methylheptadecyl)-4-methylphenol; 2,6-di(1-methylbenzyl)-4-methylphenol; 2,6-di(1-methylcyclohexyl)-4-methylphenol; 2,6-(1-methylcyclohexyl)-4-methylphenol; 2-(1-methylbenzyl)-4-methylphenol; and related substituted phenols.

More suitable antioxidants include, but are not limited to, alkylene bisphenols, such as 4,4'-butylidene bis(3-methyl-6-t-butyl phenol); 2,2-butylidene bis(4,6-dimethyl phenol); 2,2'-butylidene bis(4-methyl-6-t-butyl phenol); 2,2'-butylidene bis(4-t-butyl-6-methyl phenol); 2,2'-ethylidene bis(4-methyl-6-t-butylphenol); 2,2'-methylene bis(4,6-dimethyl phenol); 2,2'-methylene bis(4-methyl-6-t-butyl phenol); 2,2'-methylene bis(4-ethyl-6-t-butyl phenol); 4,4'-methylene bis(2,6-di-t-butyl phenol); 4,4'-methylene bis(2-methyl-6-t-butyl phenol); 4,4'-methylene bis(2,6-dimethyl phenol); 2,2'-methylene bis(4-t-butyl-6-phenyl phenol); 2,2'-dihydroxy-3,3',5,5'-tetramethylstilbene; 2,2'-isopropylidene bis(4-methyl-6-t-butyl phenol); ethylene bis(beta-naphthol); 1,5-dihydroxy naphthalene; 2,2'-ethylene bis(4-methyl-6-propyl phenol); 4,4'-methylene bis(2-propyl-6-t-butyl phenol); 4,4'-ethylene bis(2-methyl-6-propyl phenol); 2,2'-methylene bis(5-methyl-6-t-butyl phenol); and 4,4'-butylidene bis(6-t-butyl-3-methyl phenol);

Suitable antioxidants further include, but are not limited to, alkylene trisphenols, such as 2,6-bis(2'-hydroxy-3'-t-butyl-5'-methyl benzyl)-4-methyl phenol; 2,6-bis(2'-hydroxy-3'-t-ethyl-5'-butyl benzyl)-4-methyl phenol; and 2,6-bis(2'-hydroxy-3'-t-butyl-5'-propyl benzyl)-4-methyl phenol.

The antioxidant is typically present in an amount of about 0.1 phr to about 5 phr, preferably from about 0.1 phr to about 2 phr, more preferably about 0.1 phr to about 1 phr. In a particularly preferred embodiment, the antioxidant is present in an amount of about 0.4 phr. In an alternative embodiment, the antioxidant should be present in an amount to ensure that the hardness gradient of the inventive cores is negative. Preferably, about 0.2 phr to about 1 phr antioxidant is added to the core layer (inner core or outer core layer) formulation, more preferably, about 0.3 to about 0.8 phr, and most preferably 0.4 to about 0.7 phr. Preferably, about 0.25 phr to about 1.5 phr of peroxide as calculated at 100% active can be added to the core formulation, more preferably about 0.5 phr to about 1.2 phr, and most preferably about 0.7 phr to about 1.0 phr. The ZDA amount can be varied to suit the desired compression, spin and feel of the resulting golf ball. The cure regime can have a temperature range between from about 290° F. to about 335° F., more preferably about 300° F. to about 325° F., and the stock is held at that temperature for at least about 10 minutes to about 30 minutes.

The thermoset rubber composition of the present invention may also include an optional soft and fast agent. As used herein, "soft and fast agent" means any compound or a blend thereof that that is capable of making a core 1) be softer (lower compression) at constant COR or 2) have a higher COR at equal compression, or any combination thereof, when compared to a core equivalently prepared without a soft and fast agent. Preferably, the composition of the present invention contains from about 0.05 phr to about 10.0 phr soft and fast agent. In one embodiment, the soft and fast agent is present in an amount of about 0.05 phr to about 3.0 phr, preferably about 0.05 phr to about 2.0 phr, more preferably about 0.05 phr to about 1.0 phr. In another embodiment, the soft and fast agent is present in an amount of about 2.0 phr to about 5.0 phr, preferably about 2.35 phr to about 4.0 phr, and more preferably about 2.35 phr to about 3.0 phr. In an alternative high concentration embodiment, the soft and fast agent is present in an amount of about 5.0 phr to about 10.0 phr, more preferably about 6.0 phr to about 9.0 phr, most preferably about 7.0 phr to about 8.0 phr. In a most preferred embodiment, the soft and fast agent is present in an amount of about 2.6 phr.

Suitable soft and fast agents include, but are not limited to, organosulfur or metal-containing organosulfur compounds, an organic sulfur compound, including mono, di, and polysulfides, a thiol, or mercapto compound, an inorganic sulfide compound, a Group VIA compound, or mixtures thereof. The soft and fast agent component may also be a blend of an organosulfur compound and an inorganic sulfide compound.

Suitable soft and fast agents of the present invention include, but are not limited to those having the following general formula:

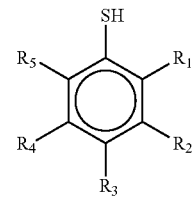

where $R_1$-$R_5$ can be $C_1$-$C_8$ alkyl groups; halogen groups; thiol groups (—SH), carboxylated groups; sulfonated groups; and hydrogen; in any order; and also pentafluorothiophenol; 2-fluorothiophenol; 3-fluorothiophenol; 4-fluorothiophenol; 2,3-fluorothiophenol; 2,4-fluorothiophenol; 3,4-fluorothiophenol; 3,5-fluorothiophenol 2,3,4-fluorothiophenol; 3,4,5-fluorothiophenol; 2,3,4,5-tetrafluorothiophenol; 2,3,5,6-tetrafluorothiophenol; 4-chlorotetrafluorothiophenol; pentachlorothiophenol; 2-chlorothiophenol; 3-chlorothiophenol; 4-chlorothiophenol; 2,3-chlorothiophenol; 2,4-chlorothiophenol; 3,4-chlorothiophenol; 3,5-chlorothiophenol; 2,3,4-chlorothiophenol; 3,4,5-chlorothiophenol; 2,3,4,5-tetrachlorothiophenol; 2,3,5,6-tetrachlorothiophenol; pentabromothiophenol; 2-bromothiophenol; 3-bromothiophenol; 4-bromothiophenol; 2,3-bromothiophenol; 2,4-bromothiophenol; 3,4-bromothiophenol; 3,5-bromothiophenol; 2,3,4-bromothiophenol; 3,4,5-bromothiophenol; 2,3,4,5-tetrabromothiophenol; 2,3,5,6-tetrabromothiophenol; pentaiodothiophenol; 2-iodothiophenol; 3-iodothiophenol; 4-iodothiophenol; 2,3-iodothiophenol; 2,4-iodothiophenol; 3,4-iodothiophenol; 3,5-iodothiophenol; 2,3,4-iodothiophenol; 3,4,5-iodothiophenol; 2,3,4,5-tetraiodothiophenol; 2,3,5,6-tetraiodothiophenoland; and their zinc salts. Preferably, the halogenated thiophenol compound is pentachlorothiophenol, which is commercially available in neat form or under the tradename STRUKTOL®, a clay-based carrier containing the sulfur compound pentachlorothiophenol loaded at 45 percent (correlating to 2.4 parts PCTP). STRUKTOL® is commercially available from Struktol Company of America of Stow, Ohio. PCTP is commercially available in neat form from eChinachem of San Francisco, Calif. and in the salt form from eChinachem of San Francisco, Calif. Most preferably, the halogenated thiophenol compound is the zinc salt of pentachlorothiophenol, which is commercially available from eChinachem of San Francisco, Calif.

As used herein when referring to the invention, the term "organosulfur compound(s)" refers to any compound containing carbon, hydrogen, and sulfur, where the sulfur is directly bonded to at least 1 carbon. As used herein, the term "sulfur compound" means a compound that is elemental sulfur, polymeric sulfur, or a combination thereof. It should be further understood that the term "elemental sulfur" refers to the ring structure of $S_8$ and that "polymeric sulfur" is a structure including at least one additional sulfur relative to elemental sulfur.

Additional suitable examples of soft and fast agents (that are also believed to be cis-to-trans catalysts) include, but are not limited to, 4,4'-diphenyl disulfide; 4,4'-ditolyl disulfide; 2,2'-benzamido diphenyl disulfide; bis(2-aminophenyl)disulfide; bis(4-aminophenyl)disulfide; bis(3-aminophenyl)disulfide; 2,2'-bis(4-aminonaphthyl)disulfide; 2,2'-bis(3-aminonaphthyl)disulfide; 2,2'-bis(4-aminonaphthyl)disulfide; 2,2'-bis(5-aminonaphthyl)disulfide; 2,2'-bis(6-aminonaphthyl)disulfide; 2,2'-bis(7-aminonaphthyl)disulfide; 2,2'-bis(8-aminonaphthyl)disulfide; 1,1'-bis(2-aminonaphthyl)disulfide; 1,1'-bis(3-aminonaphthyl)disulfide; 1,1'-bis(3-aminonaphthyl)disulfide; 1,1'-bis(4-aminonaphthyl)disulfide; 1,1'-bis(5-aminonaphthyl)disulfide; 1,1'-bis(6-aminonaphthyl)disulfide; 1,1'-bis(7-aminonaphthyl)disulfide; 1,1'-bis(8-aminonaphthyl)disulfide; 1,2'-diamino-1,2'-dithiodinaphthalene; 2,3'-diamino-1,2'-dithiodinaphthalene; bis(4-chlorophenyl)disulfide; bis(2-chlorophenyl)disulfide; bis(3-chlorophenyl)disulfide; bis(4-bromophenyl)disulfide; bis(2-bromophenyl)disulfide; bis(3-bromophenyl)disulfide; bis(4-fluorophenyl)disulfide; bis(4-iodophenyl)disulfide; bis(2,5-dichlorophenyl)disulfide; bis(3,5-dichlorophenyl)disulfide; bis(2,4-dichlorophenyl)disulfide; bis(2,6-dichlorophenyl)disulfide; bis(2,5-dibromophenyl)disulfide; bis(3,5-dibromophenyl)disulfide; bis(2-chloro-5-bromophenyl)disulfide; bis(2,4,6-trichlorophenyl)disulfide; bis(2,3,4,5,6-pentachlorophenyl)disulfide; bis(4-cyanophenyl)disulfide; bis(2-cyanophenyl)disulfide; bis(4-nitrophenyl)disulfide; bis(2-nitrophenyl)disulfide; 2,2'-dithiobenzoic acid ethylester; 2,2'-dithiobenzoic acid methylester; 2,2'-dithiobenzoic acid; 4,4'-dithiobenzoic acid ethylester; bis(4-acetylphenyl)disulfide; bis(2-acetylphenyl)disulfide; bis(4-formylphenyl)disulfide; bis(4-carbamoylphenyl)disulfide; 1,1'-dinaphthyl disulfide; 2,2'-dinaphthyl disulfide; 1,2'-dinaphthyl disulfide; 2,2'-bis(1-chlorodinaphthyl)disulfide; 2,2'-bis(1-bromonaphthyl)disulfide; 1,1'-bis(2-chloronaphthyl)disulfide; 2,2'-bis(1-cyanonaphthyl)disulfide; 2,2'-bis(1-acetylnaphthyl)disulfide; and the like; or a mixture thereof. Preferred organosulfur components include 4,4'-diphenyl disulfide, 4,4'-ditolyl disulfide, or 2,2'-benzamido diphenyl disulfide, or a mixture thereof. A more preferred organosulfur component includes 4,4'-ditolyl disulfide. In another embodiment, metal-containing organosulfur components can be used according to the invention. Suitable metal-containing organosulfur components include, but are not limited to, cadmium, copper, lead, and tellurium analogs of diethyldithiocarbamate, diamyldithiocarbamate, and dimethyldithiocarbamate, or mixtures thereof.

Suitable substituted or unsubstituted aromatic organic components that do not include sulfur or a metal include, but are not limited to, 4,4'-diphenyl acetylene, azobenzene, or a mixture thereof. The aromatic organic group preferably ranges in size from $C_6$ to $C_{20}$, and more preferably from $C_6$ to $C_{10}$. Suitable inorganic sulfide components include, but are not limited to titanium sulfide, manganese sulfide, and sulfide analogs of iron, calcium, cobalt, molybdenum, tungsten, copper, selenium, yttrium, zinc, tin, and bismuth.

A substituted or unsubstituted aromatic organic compound is also suitable as a soft and fast agent. Suitable substituted or unsubstituted aromatic organic components include, but are not limited to, components having the formula $(R_1)_x$—$R_3$-M-$R_4$—$(R_2)_y$, wherein $R_1$ and $R_2$ are each hydrogen or a substituted or unsubstituted $C_{1-20}$ linear, branched, or cyclic alkyl, alkoxy, or alkylthio group, or a single, multiple, or fused ring $C_6$ to $C_{24}$ aromatic group; x and y are each an integer from 0 to 5; $R_3$ and $R_4$ are each selected from a single, multiple, or fused ring $C_6$ to $C_{24}$ aromatic group; and M includes an azo group or a metal component. $R_3$ and $R_4$ are each preferably selected from a $C_6$ to $C_{10}$ aromatic group, more preferably selected from phenyl, benzyl, naphthyl, benzamido, and benzothiazyl. $R_1$ and $R_2$ are each preferably selected from a substituted or unsubstituted $C_{1-10}$ linear, branched, or cyclic alkyl, alkoxy, or alkylthio group or a $C_6$ to $C_{10}$ aromatic group. When $R_1$, $R_2$, $R_3$, or $R_4$, are substituted, the substitution may include one or more of the following substituent groups: hydroxy and metal salts thereof; mercapto and metal salts thereof; halogen; amino, nitro, cyano, and amido; carboxyl including esters, acids, and metal salts thereof; silyl; acrylates and metal salts thereof; sulfonyl or sulfonamide; and phosphates and phosphites. When M is a metal component, it may be any suitable elemental metal available to those of ordinary skill in the art. Typically, the metal will be a transition metal, although preferably it is tellurium or selenium. In one embodiment, the aromatic organic compound is substantially free of metal, while in another embodiment the aromatic organic compound is completely free of metal.

The soft and fast agent can also include a Group VIA component. Elemental sulfur and polymeric sulfur are commercially available from Elastochem, Inc. of Chardon, Ohio. Exemplary sulfur catalyst compounds include PB(RM-S)-80 elemental sulfur and PB(CRST)-65 polymeric sulfur, each of which is available from Elastochem, Inc. An exemplary tellurium catalyst under the tradename TELLOY® and an exemplary selenium catalyst under the tradename VANDEX® are each commercially available from RT Vanderbilt.

Other suitable soft and fast agents include, but are not limited to, hydroquinones, benzoquinones, quinhydrones, catechols, and resorcinols.

Suitable hydroquinone compounds include compounds represented by the following formula, and hydrates thereof:

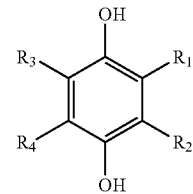

wherein each $R_1$, $R_2$, $R_3$, and $R_4$ are hydrogen; halogen; alkyl; carboxyl; metal salts thereof, and esters thereof; acetate and esters thereof; formyl; acyl; acetyl; halogenated carbonyl; sulfo and esters thereof; halogenated sulfonyl; sulfino; alkylsulfinyl; carbamoyl; halogenated alkyl; cyano; alkoxy; hydroxy and metal salts thereof; amino; nitro; aryl; aryloxy; arylalkyl; nitroso; acetamido; or vinyl.

Other suitable hydroquinone compounds include, but are not limited to, hydroquionone; tetrachlorohydroquinone; 2-chlorohydroquionone; 2-bromohydroquinone; 2,5-dichlorohydroquinone; 2,5-dibromohydroquinone; tetrabromohydroquinone; 2-methylhydroquinone; 2-t-butylhydroquinone; 2,5-di-t-amylhydroquinone; and 2-(2-chlorophenyl)hydroquinone hydrate.

More suitable hydroquinone compounds include compounds represented by the following formula, and hydrates thereof:

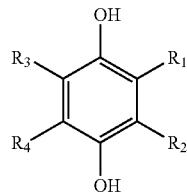

wherein each $R_1$, $R_2$, $R_3$, and $R_4$ are a metal salt of a carboxyl; acetate and esters thereof; hydroxy; a metal salt of a hydroxy; amino; nitro; aryl; aryloxy; arylalkyl; nitroso; acetamido; or vinyl.

Suitable benzoquinone compounds include compounds represented by the following formula, and hydrates thereof:

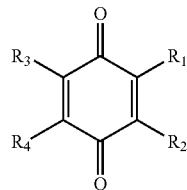

wherein each $R_1$, $R_2$, $R_3$, and $R_4$ are hydrogen; halogen; alkyl; carboxyl; metal salts thereof, and esters thereof; acetate and esters thereof; formyl; acyl; acetyl; halogenated carbonyl; sulfo and esters thereof; halogenated sulfonyl; sulfino; alkylsulfinyl; carbamoyl; halogenated alkyl; cyano; alkoxy; hydroxy and metal salts thereof; amino; nitro; aryl; aryloxy; arylalkyl; nitroso; acetamido; or vinyl.

Other suitable benzoquinone compounds include one or more compounds represented by the following formula, and hydrates thereof:

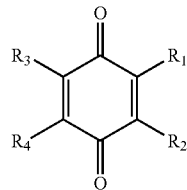

wherein each $R_1$, $R_2$, $R_3$, and $R_4$ are a metal salt of a carboxyl; acetate and esters thereof; hydroxy; a metal salt of a hydroxy; amino; nitro; aryl; aryloxy; arylalkyl; nitroso; acetamido; or vinyl.

Suitable quinhydrones include one or more compounds represented by the following formula, and hydrates thereof:

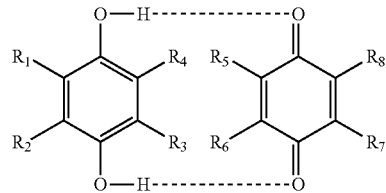

wherein each $R_1$, $R_2$, $R_3$, $R_4$, $R_5$, $R_6$, $R_7$, and $R_8$ are hydrogen; halogen; alkyl; carboxyl; metal salts thereof, and esters thereof; acetate and esters thereof; formyl; acyl; acetyl; halogenated carbonyl; sulfo and esters thereof; halogenated sulfonyl; sulfino; alkylsulfinyl; carbamoyl; halogenated alkyl; cyano; alkoxy; hydroxy and metal salts thereof; amino; nitro; aryl; aryloxy; arylalkyl; nitroso; acetamido; or vinyl.

Other suitable quinhydrones include those having the above formula, wherein each $R_1$, $R_2$, $R_3$, $R_4$, $R_5$, $R_6$, $R_7$, and $R_8$ are a metal salt of a carboxyl; acetate and esters thereof; hydroxy; a metal salt of a hydroxy; amino; nitro; aryl; aryloxy; arylalkyl; nitroso; acetamido; or vinyl. Suitable catechols include one or more compounds represented by the following formula, and hydrates thereof:

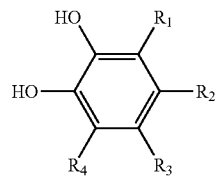

wherein each $R_1$, $R_2$, $R_3$, and $R_4$ are hydrogen; halogen; alkyl; carboxyl; metal salts thereof, and esters thereof; acetate and esters thereof; formyl; acyl; acetyl; halogenated carbonyl; sulfo and esters thereof; halogenated sulfonyl; sulfino; alkylsulfinyl; carbamoyl; halogenated alkyl; cyano; alkoxy; hydroxy and metal salts thereof; amino; nitro; aryl; aryloxy; arylalkyl; nitroso; acetamido; or vinyl.

Suitable resorcinols include one or more compounds represented by the following formula, and hydrates thereof:

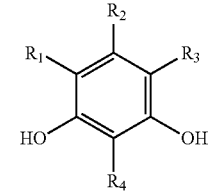

wherein each $R_1$, $R_2$, $R_3$, and $R_4$ are hydrogen; halogen; alkyl; carboxyl; metal salts thereof, and esters thereof; acetate and esters thereof; formyl; acyl; acetyl; halogenated carbonyl; sulfo and esters thereof; halogenated sulfonyl; sulfino; alkylsulfinyl; carbamoyl; halogenated alkyl; cyano; alkoxy; hydroxy and metal salts thereof; amino; nitro; aryl; aryloxy; arylalkyl; nitroso; acetamido; or vinyl.

Fillers may also be added to the thermoset rubber composition of the core to adjust the density of the composition, up or down. Typically, fillers include materials such as tungsten, zinc oxide, barium sulfate, silica, calcium carbonate, zinc carbonate, metals, metal oxides and salts, regrind (recycled core material typically ground to about 30 mesh particle), high-Mooney-viscosity rubber regrind, trans-regrind core material (recycled core material containing high trans-isomer of polybutadiene), and the like. When trans-regrind is present, the amount of trans-isomer is preferably between about 10% and about 60%. In a preferred embodiment of the invention, the core comprises polybutadiene having a cis-isomer content of greater than about 95% and trans-regrind core material (already vulcanized) as a filler. Any particle size trans-regrind core material is sufficient, but is preferably less than about 125 μm.

Fillers added to one or more portions of the golf ball typically include processing aids or compounds to affect rheological and mixing properties, density-modifying fillers, tear strength, or reinforcement fillers, and the like. The fillers are generally inorganic, and suitable fillers include numerous metals or metal oxides, such as zinc oxide and tin oxide, as well as barium sulfate, zinc sulfate, calcium carbonate, barium carbonate, clay, tungsten, tungsten carbide, an array of silicas, and mixtures thereof. Fillers may also include various foaming agents or blowing agents which may be readily selected by one of ordinary skill in the art. Fillers may include polymeric, ceramic, metal, and glass microspheres may be solid or hollow, and filled or unfilled. Fillers are typically also added to one or more portions of the golf ball to modify the density thereof to conform to uniform golf ball standards. Fillers may also be used to modify the weight of the center or at least one additional layer for specialty balls, e.g., a lower weight ball is preferred for a player having a low swing speed.

Materials such as tungsten, zinc oxide, barium sulfate, silica, calcium carbonate, zinc carbonate, metals, metal oxides and salts, and regrind (recycled core material typically ground to about 30 mesh particle) are also suitable fillers.

The polybutadiene and/or any other base rubber or elastomer system may also be foamed, or filled with hollow microspheres or with expandable microspheres which expand at a set temperature during the curing process to any low specific gravity level. Other ingredients such as sulfur accelerators, e.g., tetramethylthiuram di, tri, or tetrasulfide, and/or metal-containing organosulfur components may also be used according to the invention. Suitable metal-containing organosulfur accelerators include, but are not limited to, cadmium, copper, lead, and tellurium analogs of diethyldithiocarbamate, diamyldithiocarbamate, and dimethyldithiocarbamate, or mixtures thereof. Other ingredients such as processing aids e.g., fatty acids and/or their metal salts, processing oils, dyes and pigments, as well as other additives known to one skilled in the art may also be used in the present invention in amounts sufficient to achieve the purpose for which they are typically used.

Without being bound by theory, it is believed that the percentage of double bonds in the trans configuration may be manipulated throughout a core containing at least one main-chain unsaturated rubber (i.e., polybutadiene), plastic, or elastomer resulting in a trans gradient. The trans gradient may be influenced (up or down) by changing the type and amount of cis-to-trans catalyst (or soft-and-fast agent), the type and amount of peroxide, and the type and amount of coagent in the formulation. For example, a formulation containing about 0.25 phr ZnPCTP may have a trans gradient of about 5% across the core whereas a formulation containing about 2 phr ZnPCTP may have a trans gradient of about 10%, or higher. The trans gradient may also be manipulated through the cure times and temperatures. It is believed that lower temperatures and shorter cure times yield lower trans gradients, although a combination of many of these factors may yield gradients of differing and/or opposite directions from that resulting from use of a single factor.

In general, higher and/or faster cure rates tend to yield higher levels of trans content, as do higher concentrations of peroxides, soft-and-fast agents, and, to some extent, ZDA concentration. Even the type of rubber may have an effect on trans levels, with those catalyzed by rare-earth metals, such as Nd, being able to form higher levels of trans polybutadiene compared to those rubbers formed from Group VIII metals, such as Co, Ni, and Li.

The measurement of trans-isomer content of polybutadiene referred to herein was and can be accomplished as follows. Calibration standards are prepared using at least two polybutadiene rubber samples of known trans content, e.g., high and low percent trans-polybutadiene). These samples are used alone and blended together in such a way as to create a ladder of trans-polybutadiene content of at least about 1.5% to 50% or to bracket the unknown amount, such that the resulting calibration curve contains at least about 13 equally-spaced points.

Using a commercially-available FTIR spectrometer equipped with a Photoacoustic ("PAS") cell, a PAS spectrum of each standard was obtained using the following instrument parameters: scan at speed of 2.5 KHz (0.16 cm/s optical velocity), use a 1.2 KHz electronic filter, set an undersampling ratio of 2 (number of laser signal zero crossings before collecting a sample), co-add a minimum of 128 scans at a resolution of 4 $cm^{-1}$ over a range of 375 to 4000 $cm^{-1}$ with a sensitivity setting of 1.

The cis-, trans-, and vinyl-polybutadiene peaks are found between 600-1100 $cm^{-1}$ in the PAS spectrum. The area under each of the trans-polybutadiene peaks can be integrated. Determining the fraction of each peak area relative to the total area of the three isomer peaks allow construction of a calibration curve of the trans-polybutadiene area fraction versus the actual trans-polybutadiene content. The correlation coefficient ($R^2$) of the resulting calibration curve must be a minimum of 0.95.

A PAS spectrum is obtained, using the parameters described above, for the unknown core material at the point of interest (e.g., the surface or center of the core) by filling the PAS cell with a sample containing a freshly cut, uncontaminated surface free of foreign matters, such as mold release and the like. The trans-polybutadiene area fraction of the unknown is analyzed to determine the actual trans-isomer content from the calibration curve.

In one known circumstance when barium sulfate is included, the above method for testing trans-content may be less accurate. Thus, an additional or alternative test of the trans-content of polybutadiene is as follows. Calibration standards are prepared using at least two polybutadienes of known trans-content (e.g., high and low percent trans-polybutadiene). These samples are used alone and blended together in such a way as to create a ladder of trans-polybutadiene content of at least about 1.5% to 50% or to bracket the unknown amount, such that the resulting calibration curve contains at least about 13 equally-spaced points.

Using an FT-Raman spectrometer equipped with a near-infrared laser, a Stokes Raman spectrum should be obtained from each standard using the following instrument parameters: sufficient laser power (typically 400-800 mW) to obtain good signal-to-noise ratio without causing excessive heating or fluorescence; a resolution of 2 $cm^{-1}$; over a Raman shift spectral range of 400-4000 $cm^{-1}$; and co-adding at least 300 scans.

A calibration curve may be constructed from the data generated above, using a chemometrics approach and software, such as PLSplus/IQ from Galactic Industries Corp. An acceptable calibration was obtained with this software using a PLS-1 curve generated using an SNV (detrend) pathlength correction, a mean center data preparation, and a 5-point SG second derivative over the spectral range of 1600-1700 cm$^{-1}$. The correlation coefficient ($R^2$) of the resulting calibration curve must be at least 0.95.

Cores most suitable for the golf balls of the present invention have an outer surface and a center and are formed from a substantially homogenous rubber composition. An intermediate layer, such as a casing layer (inner cover), is disposed about the core, and a cover layer is formed around the intermediate layer, the cover typically formed from a castable polyurea or a castable polyurethane (i.e., meaning covers comprising castable polyurea (100% urea linkages/no urethane linkages); castable polyurethane (100% urethane linkages/no urea linkages); castable hybrid poly(urethane/urea) (the prepolymer is all urethane linkages and is cured with an amine); and castable hybrid poly(urea/urethane) (the prepolymer is all urea linkages and is cured with a polyol). In a preferred embodiment, the outer surface of the core has a trans-polybutadiene content of about 6% to 10%, the center of the core has a trans-polybutadiene content of about 1% to 3%, and the trans content of the outer surface of the core is greater than the trans content of the center by about 6% or greater to define a positive trans gradient along the core radius (i.e., the surface trans content is higher than the center trans content—a core having the opposite disposition of trans content would be considered to have a negative trans gradient and is also envisioned herein).

A number of cores were formed based on the formulation and cure cycle described in TABLE 1 below and core hardness values are reported in TABLE 2 below.

TABLE 1

| Formulation (phr) | Ex 1 | Ex 2 | Ex 3 | Comp Ex 1 | Comp Ex 2 | Comp Ex 3 |
|---|---|---|---|---|---|---|
| SR-526$^+$ | 34.0 | 34.0 | 31.2 | 29.0 | 29.0 | 29.0 |
| ZnO | 5 | 5 | 5 | 5 | 5 | 5 |
| BaSO$_4$ | 11.2 | 11.2 | 16.1 | 13.8 | 13.8 | 13.8 |
| VANOX MBPC* | 0.40 | 0.40 | 0.40 | — | 0.50 | — |
| TRIGONOX-265-50B** | 1.4 | 1.4 | 1.6 | — | — | 0.8 |
| PERKADOX BC-FF*** | — | — | — | 1.0 | 1.6 | — |
| polybutadiene | 100 | 100 | 100 | 100 | 100 | 100 |
| ZnPCTP | 2.35 | 2.35 | 2.60 | 2.35 | 2.35 | 2.35 |
| regrind | — | — | 17 | 17 | — | — |
| antioxidant/initiator ratio | 0.57 | 0.57 | 0.50 | — | 0.31 | — |
| Cure Temp. (° F.) | 305 | 315 | 320 | 350 | 335 | 335 |
| Cure Time (min) | 14 | 11 | 16 | 11 | 11 | 11 |
| Properties | | | | | | |
| diameter (in) | 1.530 | 1.530 | 1.530 | 1.530 | 1.530 | 1.530 |
| Atti compression | 69 | 63 | 70 | 69 | 47 | — |
| COR @ 125 ft/s | 0.808 | 0.806 | 0.804 | 0.804 | — | — |

*Vanox MBPC: 2,2'-methylene-bis-(4-methyl-6-t-butylphenol) available from R.T. Vanderbilt Company Inc.;
**Trigonox 265-50B: a mixture of 1,1-di(t-butylperoxy)-3,3,5-trimethycyclohexane and di(2-t-butylperoxyisopropyl) benzene 50% active on an inert carrier available from Akzo Nobel;
***Perkadox BC-FF: Dicumyl peroxide (99%-100% active) available from Akzo Nobel; and
$^+$SR-526: ZDA available from Sartomer

TABLE 2

| | Shore C Hardness | | | | | |
|---|---|---|---|---|---|---|
| Distance from Center | Ex 1 | Ex 2 | Ex 3 | Comp Ex 1 | Comp Ex 2 | Comp Ex 3 |
| Center | 73 | 70 | 71 | 61 | 52 | 61 |
| 2 | 74 | 71 | 72 | 67 | 57 | 62 |
| 4 | 74 | 72 | 73 | 70 | 62 | 65 |
| 6 | 75 | 73 | 73 | 72 | 64 | 67 |
| 8 | 75 | 73 | 73 | 73 | 64 | 69 |
| 10 | 75 | 73 | 74 | 73 | 64 | 71 |
| 12 | 74 | 74 | 73 | 72 | 66 | 72 |
| 14 | 74 | 74 | 72 | 73 | 70 | 73 |
| 16 | 70 | 71 | 70 | 77 | 71 | 73 |
| 18 | 60 | 60 | 63 | 80 | 72 | 73 |
| Surface | 63 | 70 | 66 | 85 | 73 | 74 |
| Surface − Center | −10 | 0 | −5 | 24 | 21 | 13 |

The surface hardness of a core is obtained from the average of a number of measurements taken from opposing hemispheres of a core, taking care to avoid making measurements on the parting line of the core or on surface defects, such as holes or protrusions. Hardness measurements are made pursuant to ASTM D-2240 "Indentation Hardness of Rubber and Plastic by Means of a Durometer." Because of the curved surface of a core, care must be taken to insure that the core is centered under the durometer indentor before a surface hardness reading is obtained. A calibrated, digital durometer, capable of reading to 0.1 hardness units is used for all hardness measurements and is set to take hardness readings at 1 second after the maximum reading is obtained. The digital durometer must be attached to, and its foot made parallel to, the base of an automatic stand, such that the weight on the durometer and attack rate conform to ASTM D-2240.

To prepare a core for hardness gradient measurements, the core is gently pressed into a hemispherical holder having an internal diameter approximately slightly smaller than the diameter of the core, such that the core is held in place in the hemispherical portion of the holder while concurrently leaving the geometric central plane of the core exposed. The core is secured in the holder by friction, such that it will not move during the cutting and grinding steps, but the friction is not so excessive that distortion of the natural shape of the core would result. The core is secured such that the parting line of the core is roughly parallel to the top of the holder. The diameter of the core is measured 90 degrees to this orientation prior to securing. A measurement is also made from the bottom of the holder to the top of the core to provide a reference point for future calculations. A rough cut, made slightly above the exposed geometric center of the core using a band saw or other appropriate cutting tool, making sure that the core does not move in the holder during this step. The remainder of the core, still in the holder, is secured to the base plate of a surface grinding machine. The exposed 'rough' core surface is ground to a smooth, flat surface, revealing the geometric center of the core, which can be verified by measuring the height of the bottom of the holder to the exposed surface of the core, making sure that exactly half of the original height of the core, as measured above, has been removed to within ±0.004 inches.

Leaving the core in the holder, the center of the core is found with a center square and carefully marked and the hardness is measured at the center mark. Hardness measurements at any distance from the center of the core may be measured by drawing a line radially outward from the center mark, and measuring and marking the distance from the center, typically in 2-mm increments. All hardness measurements performed on the plane passing through the geometric center are performed while the core is still in the holder and without having disturbed its orientation, such that the test surface is constantly parallel to the bottom of the holder. The hardness difference from any predetermined location on the core is calculated as the average surface hardness minus the hardness at the appropriate reference point, e.g., at the center of the core for single, solid core, such that a core surface softer than its center will have a negative hardness gradient.

Referring to TABLES 1-2, in Example 1, the surface is 10 Shore C points lower than the center hardness and 12 Shore C points lower than the hardest point in the core. In Example 3, the surface is 5 Shore C points lower than the center hardness and 8 Shore C points lower than the hardest point in the core. In Example 2, the center and surface hardness values are equal and the softest point in the core is 10 Shore C points lower than the surface.

In the examples of the invention presented in TABLE 1, the cure temperatures are varied from 305° F. to 320° F. and cure times are varied from 11 to 16 minutes. The core compositions of examples 1 and 2 are identical, and only the cure cycle is changed. In example 3 the amount of antioxidant is identical to examples 1 and 2, but other ingredients are varied as well the cure cycle. Additionally, the ratio of antioxidant to initiator varies from 0.50 to 0.57 from example 1 and 2 to example 3.

The ratio of antioxidant to initiator is one factor to control the surface hardness of the cores. The data shown in TABLE 2 shows that hardness gradient is at least, but not limited to, a function of the amount of antioxidant and peroxide, their ratio, and the cure cycle. It should be noted that higher antioxidant also requires higher peroxide initiator to maintain the desired compression.

The core of Comparative Example 1, whose composition is shown in TABLE 1 was cured using a conventional cure cycle, with a cure temperature of 350° F. and a cure time of 11 minutes. The inventive cores were produced using cure cycles of 305° F. for 14 minutes, 315° F. for 11 minutes and 320° F. for 16 minutes. The hardness gradients of these cores were measured and the following observations can be made. For the cores of the Comparative Examples, as expected, a conventional hard surface to soft center gradient can be clearly seen. The gradients for inventive cores follow substantially the same shape as one another.

It should be noted that in the present invention the formulation is the same throughout the core, or core layer, and no surface treatment is applied to the core to obtain the preferred surface hardness.

Thus, the cores in Examples 1, 2 and 3 have a shallow negative hardness gradient from center to surface, being formed using a curing cycle with cure temperatures of from 305° F. to 320° F., whereas the in the Comparative Examples 1, 2 and 3, steep gradient cores were formed when a conventional cure cycle with cure temperatures above 330° F. was implemented.

Examples 4, 5 and 6 in Table 3 below demonstrate a particular embodiment of a golf ball of the invention, wherein the rubber composition comprises a carbon-carbon initiator and has a difference in hardness between the core outer surface and the center of up to about 10 Shore C, yet may be advantageously formed using a cure cycle with cure temperatures above 330° F. In this regard, a number of cores were formed based on the formulations and cure cycles described in TABLE 3 below, with core hardness values at the center and surface also being reported therein:

TABLE 3

| Formulation (phr) | Ex 4 | Ex 5 | Ex 6 |
|---|---|---|---|
| Polybutadiene | 100 | 100 | 100 |
| Dymalink 526* | 27 | 27 | 27 |
| ZnO | 5 | 5 | 5 |
| $BaSO_4$ | 24.43 | 24.3 | 24.16 |
| Vulkanox BKF-75** | 0.05 | 0.15 | 0.25 |
| TRIGONOX-265-50B*** | 1.0 | 1.0 | 1.0 |
| CCDFB-90**** | 2.0 | 2.0 | 2.0 |
| ZnPCTP | 0.5 | 0.5 | 0.5 |
| Cure Temp. (° F.) | 355 | 355 | 355 |
| Cure Time (min) | 11 | 11 | 11 |
| Properties | | | |
| Diameter (in) | 1.53 | 1.53 | 1.53 |
| Compression | 80 | 75 | 68 |
| Surface Hardness (Shore C) | 79.8 | 77.7 | 75.2 |
| Center Hardness (Shore C) | 74.8 | 75.0 | 73.7 |

*SR-526: ZDA available from Sartomer
**Vulkanox ®BKF-75: antioxidant from LANXESS
***Trigonox ®265-50B: a mixture of 1,1-di(t-butylperoxy)-3,3,5-trimethycyclohexane and di(2-t-butylperoxyisopropyl)benzene 50% active on an inert carrier available from Akzo Nobel;
*****CCDFB-90 is a C-C initiator from United Initiators Referring to TABLE 3, the rubber compositions in Examples 4, 5 and 6 each include a carbon-carbon initiator and were cured at temperatures above 330° F. within a molding time of from 8 mins. to 16 mins. The resulting cores in Examples 4, 5 and 6 each have a shallow hardness gradient from center to outer surface. In particular, in Example 4, the surface hardness is 5 Shore C points greater than the center hardness. In Example 5, the surface is 2.7 Shore C points greater than the center hardness. In Example 6, the surface hardness is greater than the center hardness by 1.5 Shore C points. In contrast, the shallow gradient cores in Examples 1, 2 and 3 of TABLE 1 were produced under curing temperatures below 330° F.

Also in contrast, the cores of Comparative Examples 1, 2 and 3, whose compositions also do not include a carbon-carbon initiator (see TABLE 1), have steep hardness gradients, the difference in hardness between the core outer surface and the center being 13 Shore C or above when produced under a curing temperature above 330° F.

Accordingly, a golf ball of the invention including a core having a shallow hardness gradient as between center and surface and comprising a carbon-carbon initiator may be manufactured cheaply with increased process efficiency due to the higher curing temperature for an accompanying curing cycle of from about 8 mins. to about 16 mins.

While the inventive golf ball may be formed from a variety of differing and conventional cover materials (both intermediate layer(s) and outer cover layer), preferred cover materials include, but are not limited to:

(1) Polyurethanes, such as those prepared from polyols or polyamines and diisocyanates or polyisocyanates and/or their prepolymers, and those disclosed in U.S. Pat. Nos. 5,334,673 and 6,506,851;

(2) Polyureas, such as those disclosed in U.S. Pat. Nos. 5,484,870 and 6,835,794; and (3) Polyurethane-urea hybrids, blends or copolymers comprising urethane or urea segments.

Suitable polyurethane compositions comprise a reaction product of at least one polyisocyanate and at least one curing agent. The curing agent can include, for example, one or more polyamines, one or more polyols, or a combination thereof. The polyisocyanate can be combined with one or more polyols to form a prepolymer, which is then combined with the at least one curing agent. Thus, the polyols described herein are suitable for use in one or both components of the polyurethane material, i.e., as part of a prepolymer and in the curing agent. Suitable polyurethanes are described in U.S. Patent Application Publication No. 2005/0176523, which is incorporated by reference in its entirety.

Any polyisocyanate available to one of ordinary skill in the art is suitable for use according to the invention. Exemplary polyisocyanates include, but are not limited to, 4,4'-diphenylmethane diisocyanate (MDI); polymeric MDI; carbodiimide-modified liquid MDI; 4,4'-dicyclohexylmethane diisocyanate ($H_{12}$MDI); p-phenylene diisocyanate (PPDI); m-phenylene diisocyanate (MPDI); toluene diisocyanate (TDI); 3,3'-dimethyl-4,4'-biphenylene diisocyanate; isophoronediisocyanate; 1,6-hexamethylene diisocyanate (HDI); naphthalene diisocyanate; xylene diisocyanate; p-tetramethylxylene diisocyanate; m-tetramethylxylene diisocyanate; ethylene diisocyanate; propylene-1,2-diisocyanate; tetramethylene-1,4-diisocyanate; cyclohexyl diisocyanate; dodecane-1,12-diisocyanate; cyclobutane-1,3-diisocyanate; cyclohexane-1,3-diisocyanate; cyclohexane-1,4-diisocyanate; 1-isocyanato-3,3,5-trimethyl-5-isocyanatomethylcyclohexane; methyl cyclohexylene diisocyanate; triisocyanate of HDI; triisocyanate of 2,4,4-trimethyl-1,6-hexane diisocyanate; tetracene diisocyanate; napthalene diisocyanate; anthracene diisocyanate; isocyanurate of toluene diisocyanate; uretdione of hexamethylene diisocyanate; and mixtures thereof. Polyisocyanates are known to those of ordinary skill in the art as having more than one isocyanate group, e.g., di-isocyanate, triisocyanate, and tetra-isocyanate. Preferably, the polyisocyanate includes MDI, PPDI, TDI, or a mixture thereof, and more preferably, the polyisocyanate includes MDI. It should be understood that, as used herein, the term MDI includes 4,4'-diphenylmethane diisocyanate, polymeric MDI, carbodiimide-modified liquid MDI, and mixtures thereof and, additionally, that the diisocyanate employed may be "low free monomer," understood by one of ordinary skill in the art to have lower levels of "free" monomer isocyanate groups, typically less than about 0.1% free monomer isocyanate groups. Examples of "low free monomer" diisocyanates include, but are not limited to Low Free Monomer MDI, Low Free Monomer TDI, and Low Free Monomer PPDI. The at least one polyisocyanate should have less than about 14% unreacted NCO groups. Preferably, the at least one polyisocyanate has no greater than about 8.0% NCO, more preferably no greater than about 7.8%, and most preferably no greater than about 7.5% NCO with a level of NCO of about 7.2 or 7.0, or 6.5% NCO commonly used.

Any polyol available to one of ordinary skill in the art is suitable for use according to the invention. Exemplary polyols include, but are not limited to, polyether polyols, hydroxy-terminated polybutadiene (including partially/fully hydrogenated derivatives), polyester polyols, polycaprolactone polyols, and polycarbonate polyols. In one preferred embodiment, the polyol includes polyether polyol. Examples include, but are not limited to, polytetramethylene ether glycol (PTMEG), polyethylene propylene glycol, polyoxypropylene glycol, and mixtures thereof. The hydrocarbon chain can have saturated or unsaturated bonds and substituted or unsubstituted aromatic and cyclic groups. Preferably, the polyol of the present invention includes PTMEG.

In another embodiment, polyester polyols are included in the polyurethane material. Suitable polyester polyols include, but are not limited to, polyethylene adipate glycol; polybutylene adipate glycol; polyethylene propylene adipate glycol; o-phthalate-1,6-hexanediol; poly(hexamethylene adipate) glycol; and mixtures thereof. The hydrocarbon chain can have saturated or unsaturated bonds, or substituted or unsubstituted aromatic and cyclic groups.

In another embodiment, polycaprolactone polyols are included in the materials of the invention. Suitable polycaprolactone polyols include, but are not limited to, 1,6-hexanediol-initiated polycaprolactone, diethylene glycol initiated polycaprolactone, trimethylol propane initiated polycaprolactone, neopentyl glycol initiated polycaprolactone, 1,4-butanediol-initiated polycaprolactone, and mixtures thereof. The hydrocarbon chain can have saturated or unsaturated bonds, or substituted or unsubstituted aromatic and cyclic groups.

In yet another embodiment, polycarbonate polyols are included in the polyurethane material of the invention. Suitable polycarbonates include, but are not limited to, polyphthalate carbonate and poly(hexamethylene carbonate) glycol. The hydrocarbon chain can have saturated or unsaturated bonds, or substituted or unsubstituted aromatic and cyclic groups. In one embodiment, the molecular weight of the polyol is from about 200 to about 4000.

Polyamine curatives are also suitable for use in the polyurethane composition of the invention and have been found to improve cut, shear, and impact resistance of the resultant balls. Preferred polyamine curatives include, but are not limited to, 3,5-dimethylthio-2,4-toluenediamine and isomers thereof; 3,5-diethyltoluene-2,4-diamine and isomers thereof, such as 3,5-diethyltoluene-2,6-diamine; 4,4'-bis-(sec-butylamino)-diphenylmethane; 1,4-bis-(sec-butylamino)-benzene, 4,4'-methylene-bis-(2-chloroaniline); 4,4'-methylene-bis-(3-chloro-2,6-diethylaniline); polytetramethyleneoxide-di-p-aminobenzoate; N,N'-dialkyldiamino diphenyl methane; p,p'-methylene dianiline; m-phenylenediamine; 4,4'-methylene-bis-(2-chloroaniline); 4,4'-methylene-bis-(2,6-diethylaniline); 4,4'-methylene-bis-(2,3-dichloroaniline); 4,4'-diamino-3,3'-diethyl-5,5'-dimethyl diphenylmethane; 2,2',3,3'-tetrachloro diamino diphenylmethane; trimethylene glycol di-p-aminobenzoate; and mixtures thereof. Preferably, the curing agent of the present invention includes 3,5-dimethylthio-2,4-toluenediamine and isomers thereof, such as ETHACURE® 300, commercially available from Albermarle Corporation of Baton Rouge, La. Suitable polyamine curatives, which include both primary and secondary amines, preferably have molecular weights ranging from about 64 to about 2000.

At least one of a diol, triol, tetraol, or hydroxy-terminated curatives may be added to the aforementioned polyurethane composition. Suitable diol, triol, and tetraol groups include ethylene glycol; diethylene glycol; polyethylene glycol; propylene glycol; polypropylene glycol; lower molecular weight polytetramethylene ether glycol; 1,3-bis(2-hydroxyethoxy) benzene; 1,3-bis-[2-(2-hydroxyethoxy) ethoxy]benzene; 1,3-bis-{2-[2-(2-hydroxyethoxy) ethoxy]ethoxy}benzene; 1,4-butanediol; 1,5-pentanediol; 1,6-hexanediol; resorcinol-di-(β-hydroxyethyl)ether; hydroquinone-di-β-hydroxyethyl) ether; and mixtures thereof. Preferred hydroxy-terminated curatives include 1,3-bis(2-hydroxyethoxy) benzene; 1,3-bis-[2-(2-hydroxyethoxy) ethoxy]benzene; 1,3-bis-{2-[2-(2-hydroxyethoxy) ethoxy]ethoxy}benzene; 1,4-butanediol, and mixtures thereof. Preferably, the hydroxy-terminated curatives have molecular weights ranging from about 48 to 2000. It should be understood that molecular weight, as used herein, is the absolute weight average molecular weight and would be understood as such by one of ordinary skill in the art.

Both the hydroxy-terminated and amine curatives can include one or more saturated, unsaturated, aromatic, and cyclic groups. Additionally, the hydroxy-terminated and amine curatives can include one or more halogen groups. The polyurethane composition can be formed with a blend or mixture of curing agents. If desired, however, the polyurethane composition may be formed with a single curing agent.

In a preferred embodiment of the present invention, saturated polyurethanes are used to form one or more of the cover layers, preferably the outer cover layer, and may be selected from among both castable thermoset and thermoplastic polyurethanes.

In this embodiment, the saturated polyurethanes of the present invention are substantially free of aromatic groups or moieties. Saturated polyurethanes suitable for use in the invention are a product of a reaction between at least one polyurethane prepolymer and at least one saturated curing agent. The polyurethane prepolymer is a product formed by a reaction between at least one saturated polyol and at least one saturated diisocyanate. As is well known in the art, that a catalyst may be employed to promote the reaction between the curing agent and the isocyanate and polyol, or the curing agent and the prepolymer.

Saturated diisocyanates which can be used include, without limitation, ethylene diisocyanate; propylene-1,2-diisocyanate; tetramethylene-1,4-diisocyanate; 1,6-hexamethylene-diisocyanate (HDI); 2,2,4-trimethylhexamethylene diisocyanate; 2,4,4-trimethylhexamethylene diisocyanate; dodecane-1,12-diisocyanate; dicyclohexylmethane diisocyanate; cyclobutane-1,3-diisocyanate; cyclohexane-1,3-diisocyanate; cyclohexane-1,4-diisocyanate; 1-isocyanato-3,3,5-trimethyl-5-isocyanatomethylcyclohexane; isophorone diisocyanate; methyl cyclohexylene diisocyanate; triisocyanate of HDI; triisocyanate of 2,2,4-trimethyl-1,6-hexane diisocyanate. The most preferred saturated diisocyanates are 4,4'-dicyclohexylmethane diisocyanate and isophorone diisocyanate.

Saturated polyols which are appropriate for use in this invention include without limitation polyether polyols such as polytetramethylene ether glycol and poly(oxypropylene) glycol. Suitable saturated polyester polyols include polyethylene adipate glycol, polyethylene propylene adipate glycol, polybutylene adipate glycol, polycarbonate polyol and ethylene oxide-capped polyoxypropylene diols. Saturated polycaprolactone polyols which are useful in the invention include diethylene glycol-initiated polycaprolactone, 1,4-butanediol-initiated polycaprolactone, 1,6-hexanediol-initiated polycaprolactone; trimethylol propane-initiated polycaprolactone, neopentyl glycol initiated polycaprolactone, and polytetramethylene ether glycol-initiated polycaprolactone. The most preferred saturated polyols are polytetramethylene ether glycol and PTMEG-initiated polycaprolactone.

Suitable saturated curatives include 1,4-butanediol, ethylene glycol, diethylene glycol, polytetramethylene ether glycol, propylene glycol; trimethanolpropane; tetra-(2-hydroxypropyl)-ethylenediamine; isomers and mixtures of isomers of cyclohexyldimethylol, isomers and mixtures of isomers of cyclohexane bis(methylamine); triisopropanolamine; ethylene diamine; diethylene triamine; triethylene tetramine; tetraethylene pentamine; 4,4'-dicyclohexylmethane diamine; 2,2,4-trimethyl-1,6-hexanediamine; 2,4,4-trimethyl-1,6-hexanediamine; diethyleneglycol di-(aminopropyl)ether; 4,4'-bis-(sec-butylamino)-dicyclohexylmethane; 1,2-bis-(sec-butylamino)cyclohexane; 1,4-bis-(sec-butylamino) cyclohexane; isophorone diamine; hexamethylene diamine; propylene diamine; 1-methyl-2,4-cyclohexyl diamine; 1-methyl-2,6-cyclohexyl diamine; 1,3-diaminopropane; dimethylamino propylamine; diethylamino propylamine; imido-bis-propylamine; isomers and mixtures of isomers of diaminocyclohexane; monoethanolamine; diethanolamine; triethanolamine; monoisopropanolamine; and diisopropanolamine. The most preferred saturated curatives are 1,4-butanediol, 1,4-cyclohexyldimethylol and 4,4'-bis-(sec-butylamino)-dicyclohexylmethane.

Alternatively, other suitable polymers include partially or fully neutralized ionomer, metallocene, or other single-site catalyzed polymer, polyester, polyamide, non-ionomeric thermoplastic elastomer, copolyether-esters, copolyether-amides, polycarbonate, polybutadiene, polyisoprene, polystryrene block copolymers (such as styrene-butadiene-styrene), styrene-ethylene-propylene-styrene, styrene-ethylene-butylene-styrene, and the like, and blends thereof. Thermosetting polyurethanes or polyureas are suitable for the outer cover layers of the golf balls of the present invention.

Additionally, polyurethane can be replaced with or blended with a polyurea material. Polyureas are distinctly different from polyurethane compositions, but also result in desirable aerodynamic and aesthetic characteristics when used in golf ball components. The polyurea-based compositions are preferably saturated in nature.

Without being bound to any particular theory, it is now believed that substitution of the long chain polyol segment in the polyurethane prepolymer with a long chain polyamine oligomer soft segment to form a polyurea prepolymer, improves shear, cut, and resiliency, as well as adhesion to other components. Thus, the polyurea compositions of this invention may be formed from the reaction product of an isocyanate and polyamine prepolymer crosslinked with a curing agent. For example, polyurea-based compositions of the invention may be prepared from at least one isocyanate, at least one polyether amine, and at least one diol curing agent or at least one diamine curing agent.

Any polyamine available to one of ordinary skill in the art is suitable for use in the polyurea prepolymer. Polyether amines are particularly suitable for use in the prepolymer. As used herein, "polyether amines" refer to at least polyoxyalkyleneamines containing primary amino groups attached to the terminus of a polyether backbone. Due to the rapid reaction of isocyanate and amine, and the insolubility of many urea products, however, the selection of diamines and polyether amines is limited to those allowing the successful formation of the polyurea prepolymers. In one embodiment, the polyether backbone is based on tetramethylene, propylene, ethylene, trimethylolpropane, glycerin, and mixtures thereof.

Suitable polyether amines include, but are not limited to, methyldiethanolamine; polyoxyalkylenediamines such as, polytetramethylene ether diamines, polyoxypropylenetriamine, and polyoxypropylene diamines; poly(ethylene oxide capped oxypropylene) ether diamines; propylene oxide-based triamines; triethyleneglycoldiamines; trimethylolpropane-based triamines; glycerin-based triamines; and mixtures thereof. In one embodiment, the polyether amine used to form the prepolymer is JEFFAMINE® D2000 (manufactured by Huntsman Chemical Co. of Austin, Tex.).

The molecular weight of the polyether amine for use in the polyurea prepolymer may range from about 100 to about 5000. In one embodiment, the polyether amine molecular weight is about 200 or greater, preferably about 230 or greater. In another embodiment, the molecular weight of the polyether amine is about 4000 or less. In yet another embodiment, the molecular weight of the polyether amine is about 600 or greater. In still another embodiment, the molecular weight of the polyether amine is about 3000 or less. In yet another embodiment, the molecular weight of the polyether amine is between about 1000 and about 3000, and more preferably is between about 1500 to about 2500. Because lower molecular weight polyether amines may be prone to forming solid polyureas, a higher molecular weight oligomer, such as JEFFAMINE® D2000, is preferred.

As briefly discussed above, some amines may be unsuitable for reaction with the isocyanate because of the rapid reaction between the two components. In particular, shorter chain amines are fast reacting. In one embodiment, however, a hindered secondary diamine may be suitable for use in the prepolymer. Without being bound to any particular theory, it is believed that an amine with a high level of stearic hindrance, e.g., a tertiary butyl group on the nitrogen atom, has a slower reaction rate than an amine with no hindrance or a low level of hindrance. For example, 4,4'-bis-(sec-butylamino)-dicyclohexylmethane (CLEARLINK® 1000) may be suitable for use in combination with an isocyanate to form the polyurea prepolymer.

Any isocyanate available to one of ordinary skill in the art is suitable for use in the polyurea prepolymer. Isocyanates for use with the present invention include aliphatic, cycloaliphatic, araliphatic, aromatic, any derivatives thereof, and combinations of these compounds having two or more isocyanate (NCO) groups per molecule. The isocyanates may be organic polyisocyanate-terminated prepolymers. The isocyanate-containing reactable component may also include any isocyanate-functional monomer, dimer, trimer, or multimeric adduct thereof, prepolymer, quasi-prepolymer, or mixtures thereof. Isocyanate-functional compounds may include monoisocyanates or polyisocyanates that include any isocyanate functionality of two or more.

Suitable isocyanate-containing components include diisocyanates having the generic structure: O=C=N—R—N=C=O, where R is preferably a cyclic, aromatic, or linear or branched hydrocarbon moiety containing from about 1 to about 20 carbon atoms. The diisocyanate may also contain one or more cyclic groups or one or more phenyl groups. When multiple cyclic or aromatic groups are present, linear and/or branched hydrocarbons containing from about 1 to about 10 carbon atoms can be present as spacers between the cyclic or aromatic groups. In some cases, the cyclic or aromatic group(s) may be substituted at the 2-, 3-, and/or 4-positions, or at the ortho-, meta-, and/or para-positions, respectively. Substituted groups may include, but are not limited to, halogens, primary, secondary, or tertiary hydrocarbon groups, or a mixture thereof.

Examples of diisocyanates that can be used with the present invention include, but are not limited to, substituted and isomeric mixtures including 2,2'-, 2,4'-, and 4,4'-diphenylmethane diisocyanate; 3,3'-dimethyl-4,4'-biphenylene diisocyanate; toluene diisocyanate; polymeric MDI; carbodiimide-modified liquid 4,4'-diphenylmethane diisocyanate; para-phenylene diisocyanate; meta-phenylene diisocyanate; triphenyl methane-4,4'- and triphenyl methane-4,4'-triisocyanate; naphthylene-1,5-diisocyanate; 2,4'-, 4,4'-, and 2,2-biphenyl diisocyanate; polyphenyl polymethylene polyisocyanate; mixtures of MDI and PMDI; mixtures of PMDI and TDI; ethylene diisocyanate; propylene-1,2-diisocyanate; tetramethylene-1,2-diisocyanate; tetramethylene-1,3-diisocyanate; tetramethylene-1,4-diisocyanate; 1,6-hexamethylene-diisocyanate; octamethylene diisocyanate; decamethylene diisocyanate; 2,2,4-trimethylhexamethylene diisocyanate; 2,4,4-trimethylhexamethylene diisocyanate; dodecane-1,12-diisocyanate; cyclobutane-1,3-diisocyanate; cyclohexane-1,2-diisocyanate; cyclohexane-1,3-diisocyanate; cyclohexane-1,4-diisocyanate; methyl-cyclohexylene diisocyanate; 2,4-methylcyclohexane diisocyanate; 2,6-methylcyclohexane diisocyanate; 4,4'-dicyclohexyl diisocyanate; 2,4'-dicyclohexyl diisocyanate; 1,3,5-cyclohexane triisocyanate; isocyanatomethylcyclohexane isocyanate; 1-isocyanato-3,3,5-trimethyl-5-isocyanatomethylcyclohexane; isocyanatoethylcyclohexane isocyanate; bis(isocyanatomethyl)-cyclohexane diisocyanate; 4,4'-bis(isocyanatomethyl) dicyclohexane; 2,4'-bis(isocyanatomethyl) dicyclohexane; isophorone diisocyanate; triisocyanate of HDI; triisocyanate of 2,2,4-trimethyl-1,6-hexane diisocyanate; 4,4'-dicyclohexylmethane diisocyanate; 2,4-hexahydrotoluene diisocyanate; 2,6-hexahydrotoluene diisocyanate; 1,2-, 1,3-, and 1,4-phenylene diisocyanate; aromatic aliphatic isocyanate, such as 1,2-, 1,3-, and 1,4-xylene diisocyanate; meta-tetramethylxylene diisocyanate; para-tetramethylxylene diisocyanate; trimerized isocyanurate of any polyisocyanate, such as isocyanurate of toluene diisocyanate, trimer of diphenylmethane diisocyanate, trimer of tetramethylxylene diisocyanate, isocyanurate of hexamethylene diisocyanate, isocyanurate of isophorone diisocyanate, and mixtures thereof; dimerized uredione of any polyisocyanate, such as uretdione of toluene diisocyanate, uretdione of hexamethylene diisocyanate, and mixtures thereof; modified polyisocyanate derived from the above isocyanates and polyisocyanates; and mixtures thereof.

Examples of saturated diisocyanates that can be used with the present invention include, but are not limited to, ethylene diisocyanate; propylene-1,2-diisocyanate; tetramethylene diisocyanate; tetramethylene-1,4-diisocyanate; 1,6-hexamethylene-diisocyanate; octamethylene diisocyanate; decamethylene diisocyanate; 2,2,4-trimethylhexamethylene diisocyanate; 2,4,4-trimethylhexamethylene diisocyanate; dodecane-1,12-diisocyanate; cyclobutane-1,3-diisocyanate; cyclohexane-1,2-diisocyanate; cyclohexane-1,3-diisocyanate; cyclohexane-1,4-diisocyanate; methyl-cyclohexylene diisocyanate; 2,4-methylcyclohexane diisocyanate; 2,6-methylcyclohexane diisocyanate; 4,4'-dicyclohexyl diisocyanate; 2,4'-dicyclohexyl diisocyanate; 1,3,5-cyclohexane triisocyanate; isocyanatomethylcyclohexane isocyanate; 1-isocyanato-3,3,5-trimethyl-5-isocyanatomethylcyclohexane; isocyanatoethylcyclohexane isocyanate; bis(isocyanatomethyl)-cyclohexane diisocyanate; 4,4'-bis(isocyanatomethyl) dicyclohexane; 2,4'-bis(isocyanatomethyl) dicyclohexane; isophorone diisocyanate; triisocyanate of HDI; triisocyanate of 2,2,4-trimethyl-1,6-hexane diisocyanate; 4,4'-dicyclohexylmethane diisocyanate; 2,4-hexahydrotoluene diisocyanate; 2,6-hexahydrotoluene diisocyanate; and mixtures thereof. Aromatic aliphatic isocyanates may also be used to form light stable materials. Examples of such isocyanates include 1,2-, 1,3-, and 1,4-xylene diisocyanate; meta-tetramethylxylene diisocyanate; para-tetramethylxylene diisocyanate; trimerized isocyanurate of any polyisocyanate, such as isocyanurate of toluene diisocyanate, trimer of diphenylmethane diisocyanate, trimer of tetramethylxylene diisocyanate, isocyanurate of hexamethylene diisocyanate, isocyanurate of isophorone diisocyanate, and mixtures thereof; dimerized uredione of any polyisocyanate, such as uretdione of toluene diisocyanate, uretdione of hexamethylene diisocyanate, and mixtures thereof; modified polyisocyanate derived from the above isocyanates and polyisocyanates; and mixtures thereof. In addition, the aromatic aliphatic isocyanates may be mixed with any of the saturated isocyanates listed above for the purposes of this invention.

The number of unreacted NCO groups in the polyurea prepolymer of isocyanate and polyether amine may be varied to control such factors as the speed of the reaction, the resultant hardness of the composition, and the like. For instance, the number of unreacted NCO groups in the polyurea prepolymer of isocyanate and polyether amine may be less than about 14 percent. In one embodiment, the polyurea prepolymer has from about 5 percent to about 11 percent unreacted NCO groups, and even more preferably has from about 6 to about 9.5 percent unreacted NCO groups. In one embodiment, the percentage of unreacted NCO groups is about 3 percent to about 9 percent. Alternatively, the percentage of unreacted NCO groups in the polyurea prepolymer may be about 7.5 percent or less, and more preferably, about 7 percent or less. In another embodiment, the unreacted NCO content is from about 2.5 percent to about 7.5 percent, and more preferably from about 4 percent to about 6.5 percent.

When formed, polyurea prepolymers may contain about 10 percent to about 20 percent by weight of the prepolymer of free isocyanate monomer. Thus, in one embodiment, the polyurea prepolymer may be stripped of the free isocyanate monomer. For example, after stripping, the prepolymer may contain about 1 percent or less free isocyanate monomer. In another embodiment, the prepolymer contains about 0.5 percent by weight or less of free isocyanate monomer.

The polyether amine may be blended with additional polyols to formulate copolymers that are reacted with excess isocyanate to form the polyurea prepolymer. In one embodiment, less than about 30 percent polyol by weight of the copolymer is blended with the saturated polyether amine. In another embodiment, less than about 20 percent polyol by weight of the copolymer, preferably less than about 15 percent by weight of the copolymer, is blended with the polyether amine. The polyols listed above with respect to the polyurethane prepolymer, e.g., polyether polyols, polycaprolactone polyols, polyester polyols, polycarbonate polyols, hydrocarbon polyols, other polyols, and mixtures thereof, are also suitable for blending with the polyether amine. The molecular weight of these polymers may be from about 200 to about 4000, but also may be from about 1000 to about 3000, and more preferably are from about 1500 to about 2500.

The polyurea composition can be formed by crosslinking the polyurea prepolymer with a single curing agent or a blend of curing agents. The curing agent of the invention is preferably an amine-terminated curing agent, more preferably a secondary diamine curing agent so that the composition contains only urea linkages. In one embodiment, the amine-terminated curing agent may have a molecular weight of about 64 or greater. In another embodiment, the molecular weight of the amine-curing agent is about 2000 or less. As discussed above, certain amine-terminated curing agents may be modified with a compatible amine-terminated freezing point depressing agent or mixture of compatible freezing point depressing agents.

Suitable amine-terminated curing agents include, but are not limited to, ethylene diamine; hexamethylene diamine; 1-methyl-2,6-cyclohexyl diamine; tetrahydroxypropylene ethylene diamine; 2,2,4- and 2,4,4-trimethyl-1,6-hexanediamine; 4,4'-bis-(sec-butylamino)-dicyclohexylmethane; 1,4-bis-(sec-butylamino)-cyclohexane; 1,2-bis-(sec-butylamino)-cyclohexane; derivatives of 4,4'-bis-(sec-butylamino)-dicyclohexylmethane; 4,4'-dicyclohexylmethane diamine; 1,4-cyclohexane-bis-(methylamine); 1,3-cyclohexane-bis-(methylamine); diethylene glycol di-(aminopropyl)ether; 2-methylpentamethylene-diamine; diaminocyclohexane; diethylene triamine; triethylene tetramine; tetraethylene pentamine; propylene diamine; 1,3-diaminopropane; dimethylamino propylamine; diethylamino propylamine; dipropylene triamine; imido-bis-propylamine; monoethanolamine, diethanolamine; triethanolamine; monoisopropanolamine, diisopropanolamine; isophoronediamine; 4,4'-methylenebis-(2-chloroaniline); 3,5; dimethylthio-2,4-toluenediamine; 3,5-dimethylthio-2,6-toluenediamine; 3,5-diethylthio-2,4-toluenediamine; 3,5; diethylthio-2,6-toluenediamine; 4,4'-bis-(sec-butylamino)-diphenylmethane and derivatives thereof; 1,4-bis-(sec-butylamino)-benzene; 1,2-bis-(sec-butylamino)-benzene; N,N'-dialkylamino-diphenylmethane; N,N,N',N'-tetrakis (2-hydroxypropyl)ethylene diamine; trimethyleneglycol-di-p-aminobenzoate; polytetramethyleneoxide-di-p-aminobenzoate; 4,4'-methylenebis-(3-chloro-2,6-diethyleneaniline); 4,4'-methylenebis-(2,6-diethylaniline); meta-phenylenediamine; paraphenylenediamine; and mixtures thereof. In one embodiment, the amine-terminated curing agent is 4,4'-bis-(sec-butylamino)-dicyclohexylmethane.

Suitable saturated amine-terminated curing agents include, but are not limited to, ethylene diamine; hexamethylene diamine; 1-methyl-2,6-cyclohexyl diamine; tetrahydroxypropylene ethylene diamine; 2,2,4- and 2,4,4-trimethyl-1,6-hexanediamine; 4,4'-bis-(sec-butylamino)-dicyclohexylmethane; 1,4-bis-(sec-butylamino)-cyclohexane; 1,2-bis-(sec-butylamino)-cyclohexane; derivatives of 4,4'-bis-(sec-butylamino)-dicyclohexylmethane; 4,4'-dicyclohexylmethane diamine; 4,4'-methylenebis-(2,6-diethylaminocyclohexane; 1,4-cyclohexane-bis-(methylamine); 1,3-cyclohexane-bis-(methylamine); diethylene glycol di-(aminopropyl)ether; 2-methylpentamethylene-diamine; diaminocyclohexane; diethylene triamine; triethylene tetramine; tetraethylene pentamine; propylene diamine; 1,3-diaminopropane; dimethylamino propylamine; diethylamino propylamine; imido-bis-propylamine; monoethanolamine, diethanolamine; triethanolamine; monoisopropanolamine, diisopropanolamine; isophoronediamine; triisopropanolamine; and mixtures thereof. In addition, any of the polyether amines listed above may be used as curing agents to react with the polyurea prepolymers.

Cover layers of the inventive golf ball may also be formed from ionomeric polymers, preferably highly-neutralized ionomers (HNP). In a preferred embodiment, at least one intermediate layer of the golf ball is formed from an HNP material or a blend of HNP materials. The acid moieties of the HNP's, typically ethylene-based ionomers, are preferably neutralized greater than about 70%, more preferably greater than about 90%, and most preferably at least about 100%. The HNP's can be also be blended with a second polymer component, which, if containing an acid group, may be neutralized in a conventional manner, by the organic fatty acids of the present invention, or both. The second polymer component, which may be partially or fully neutralized, preferably comprises ionomeric copolymers and terpolymers, ionomer precursors, thermoplastics, polyamides, polycarbonates, polyesters, polyurethanes, polyureas, thermoplastic elastomers, polybutadiene rubber, balata, metallocene-catalyzed polymers (grafted and non-grafted), single-site polymers, high-crystalline acid polymers, cationic ionomers, and the like. HNP polymers typically have a material hardness of between about 20 and about 80 Shore D, and a flexural modulus of between about 3,000 psi and about 200,000 psi.

In one embodiment of the present invention the HNP's are ionomers and/or their acid precursors that are preferably neutralized, either fully or partially, with organic acid copolymers or the salts thereof. The acid copolymers are preferably α-olefin, such as ethylene, $C_{3-8}$ α,β-ethylenically unsaturated carboxylic acid, such as acrylic and methacrylic acid, copolymers. They may optionally contain a softening monomer, such as alkyl acrylate and alkyl methacrylate, wherein the alkyl groups have from 1 to 8 carbon atoms.

The acid copolymers can be described as E/X/Y copolymers where E is ethylene, X is an α,β-ethylenically unsaturated carboxylic acid, and Y is a softening comonomer. In a preferred embodiment, X is acrylic or methacrylic acid and Y is a $C_{1-8}$ alkyl acrylate or methacrylate ester. X is preferably present in an amount from about 1 to about 35 weight percent of the polymer, more preferably from about 5 to about 30 weight percent of the polymer, and most preferably from about 10 to about 20 weight percent of the polymer. Y is preferably present in an amount from about 0 to about 50 weight percent of the polymer, more preferably from about 5 to about 25 weight percent of the polymer, and most preferably from about 10 to about 20 weight percent of the polymer.

Specific acid-containing ethylene copolymers include, but are not limited to, ethylene/acrylic acid/n-butyl acrylate, ethylene/methacrylic acid/n-butyl acrylate, ethylene/methacrylic acid/iso-butyl acrylate, ethylene/acrylic acid/iso-butyl acrylate, ethylene/methacrylic acid/n-butyl methacrylate, ethylene/acrylic acid/methyl methacrylate, ethylene/acrylic acid/methyl acrylate, ethylene/methacrylic acid/methyl acrylate, ethylene/methacrylic acid/methyl methacrylate, and ethylene/acrylic acid/n-butyl methacrylate. Preferred acid-containing ethylene copolymers include, ethylene/methacrylic acid/n-butyl acrylate, ethylene/acrylic acid/n-butyl acrylate, ethylene/methacrylic acid/methyl acrylate, ethylene/acrylic acid/ethyl acrylate, ethylene/methacrylic acid/ethyl acrylate, and ethylene/acrylic acid/methyl acrylate copolymers. The most preferred acid-containing ethylene copolymers are, ethylene/(meth)acrylic acid/n-butyl, acrylate, ethylene/(meth)acrylic acid/ethyl acrylate, and ethylene/(meth)acrylic acid/methyl acrylate copolymers.

Ionomers are typically neutralized with a metal cation, such as Li, Na, Mg, K, Ca, or Zn. It has been found that by adding sufficient organic acid or salt of organic acid, along with a suitable base, to the acid copolymer or ionomer, however, the ionomer can be neutralized, without losing processability, to a level much greater than for a metal cation. Preferably, the acid moieties are neutralized greater than about 80%, preferably from 90-100%, most preferably 100% without losing processability. This accomplished by melt-blending an ethylene α,β-ethylenically unsaturated carboxylic acid copolymer, for example, with an organic acid or a salt of organic acid, and adding a sufficient amount of a cation source to increase the level of neutralization of all the acid moieties (including those in the acid copolymer and in the organic acid) to greater than 90%, (preferably greater than 100%).

The organic acids of the present invention are aliphatic, mono- or multi-functional (saturated, unsaturated, or multi-unsaturated) organic acids. Salts of these organic acids may also be employed. The salts of organic acids of the present invention include the salts of barium, lithium, sodium, zinc, bismuth, chromium, cobalt, copper, potassium, strontium, titanium, tungsten, magnesium, cesium, iron, nickel, silver, aluminum, tin, or calcium, salts of fatty acids, particularly stearic, behenic, erucic, oleic, linoelic or dimerized derivatives thereof. It is preferred that the organic acids and salts of the present invention be relatively non-migratory (they do not bloom to the surface of the polymer under ambient temperatures) and non-volatile (they do not volatilize at temperatures required for melt-blending).

The ionomers of the invention may also be more conventional ionomers, i.e., partially-neutralized with metal cations. The acid moiety in the acid copolymer is neutralized about 1 to about 90%, preferably at least about 20 to about 75%, and more preferably at least about 40 to about 70%, to form an ionomer, by a cation such as lithium, sodium, potassium, magnesium, calcium, barium, lead, tin, zinc, aluminum, or a mixture thereof.

In a preferred embodiment, the inventive single-layer core is enclosed with two cover layers, where the inner cover layer has a thickness of about 0.01 inches to about 0.06 inches, more preferably about 0.015 inches to about 0.040 inches, and most preferably about 0.02 inches to about 0.035 inches, and the inner cover layer is formed from a partially- or fully-neutralized ionomer having a Shore D hardness of greater than about 55, more preferably greater than about 60, and most preferably greater than about 65. In this embodiment, the outer cover layer should have a thickness of about 0.015 inches to about 0.055 inches, more preferably about 0.02 inches to about 0.04 inches, and most preferably about 0.025 inches to about 0.035 inches, and has a hardness of about Shore D 60 or less, more preferably 55 or less, and most preferably about 52 or less. The inner cover layer should be harder than the outer cover layer. In this embodiment the outer cover layer comprises a partially- or fully-neutralized ionomer, a polyurethane, polyurea, or blend thereof. A most preferred outer cover layer is a castable or reaction injection molded polyurethane, polyurea or copolymer or hybrid thereof having a Shore D hardness of about 40 to about 50. A most preferred inner cover layer material is a partially-neutralized ionomer comprising a zinc, sodium or lithium neutralized ionomer such as SURLYN® 8940, 8945, 9910, 7930, 7940, or blend thereof having a Shore D hardness of about 63 to about 68.

In another multi-layer cover, single core embodiment, the outer cover and inner cover layer materials and thickness are the same but, the hardness range is reversed, that is, the outer cover layer is harder than the inner cover layer.

In an alternative preferred embodiment, the golf ball is a one-piece golf ball having a dimpled surface and having a surface hardness equal to or less than the center hardness (i.e., a negative hardness gradient). The one-piece ball preferably has a diameter of about 1.680 inches to about 1.690 inches, a weight of about 1.620 oz, an Atti compression of from about 40 to 120, and a COR of about 0.750 to 0.825.

In a preferred two-piece ball embodiment, the single-layer core having a negative hardness gradient is enclosed with a single layer of cover material having a Shore D hardness of from about 20 to about 80, more preferably about 40 to about 75 and most preferably about 45 to about 70, and comprises a thermoplastic or thermosetting polyurethane, polyurea, polyamide, polyester, polyester elastomer, polyether-amide or polyester-amide, partially or fully neutralized ionomer, polyolefin such as polyethylene, polypropylene, polyethylene copolymers such as ethylene-butyl acrylate or ethylene-methyl acrylate, poly(ethylene methacrylic acid) co- and terpolymers, metallocene-catalyzed polyolefins and polar-group functionalized polyolefins and blends thereof. A preferred cover material in the two-piece embodiment is an ionomer (either conventional or HNP) having a hardness of about 50 to about 70 Shore D. Another preferred cover material in the two-piece embodiment is a thermoplastic or thermosetting polyurethane or polyurea. A preferred ionomer is a high acid ionomer comprising a copolymer of ethylene and methacrylic or acrylic acid and having an acid content of at least 16 to about 25 weight percent. In this case the reduced spin contributed by the relatively rigid high acid ionomer may be offset to some extent by the spin-increasing negative gradient core. The core may have a diameter of about 1.0 inch to about 1.64 inches, preferably about 1.30 inches to about 1.620 inches, and more preferably about 1.40 inches to about 1.60 inches.

Another preferred cover material comprises a castable or reaction injection moldable polyurethane, polyurea, or copolymer or hybrid of polyurethane/polyurea. Preferably, this cover is thermosetting but may be a thermoplastic, having a Shore D hardness of about 20 to about 70, more preferably about 30 to about 65 and most preferably about 35 to about 60. A moisture vapor barrier layer, such as disclosed in U.S. Pat. Nos. 6,632,147; 6,932,720; 7,004,854; and 7,182,702, all of which are incorporated by reference herein in their entirety, are optionally employed between the cover layer and the core.

While any of the embodiments herein may have any known dimple number and pattern, a preferred number of dimples is 252 to 456, and more preferably is 330 to 392. The dimples may comprise any width, depth, and edge angle disclosed in the prior art and the patterns may comprises multitudes of dimples having different widths, depths and edge angles. The parting line configuration of said pattern may be either a straight line or a staggered wave parting line (SWPL). Most preferably the dimple number is 330, 332, or 392 and comprises 5 to 7 dimples sizes and the parting line is a SWPL.

Other than in the operating examples, or unless otherwise expressly specified, all of the numerical ranges, amounts, values and percentages such as those for amounts of materials and others in the specification may be read as if prefaced by the word "about" even though the term "about" may not expressly appear with the value, amount or range. Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements. Furthermore, when numerical ranges of varying scope are set forth herein, it is contemplated that any combination of these values inclusive of the recited values may be used.

While it is apparent that the illustrative embodiments of the invention disclosed herein fulfill the objective stated above, it is appreciated that numerous modifications and other embodiments may be devised by those skilled in the art. Therefore, it will be understood that the appended claims are intended to cover all such modifications and embodiments, which would come within the spirit and scope of the present invention.

What is claimed is:

1. A golf ball comprising:
a core having an outer surface and a geometric center and being formed from a substantially homogenous rubber composition comprising a carbon-carbon initiator;
an intermediate layer disposed about the core; and
a cover layer disposed about the intermediate layer;
wherein the outer surface has a hardness that differs from a hardness at the geometric center by up to about 5 Shore C.

2. The golf ball of claim 1, wherein the hardness of the outer surface differs from the hardness at the geometric center by less than about 3 Shore C.

3. The golf ball of claim 1, wherein the hardness of the outer surface is substantially the same as the hardness at the geometric center.

4. The golf ball of claim 1, wherein the geometric center has a hardness of from about 55 Shore C to about 82 Shore C.

5. The golf ball of claim 1, wherein the rubber composition comprises the carbon-carbon initiator in an amount of from about 0.2 phr to about 2.0 phr.

6. The golf ball of claim 1, the core being molded for about 8 min. to about 16 min. at a cure temperature of greater than 330° F.

7. The golf ball of claim 1, wherein the rubber composition comprises an antioxidant in a ratio of antioxidant to active initiator used in said rubber composition of about 0.4 or greater.

8. The golf ball of claim 1, wherein the core has a compression of from about 40 atti to about 100 atti.

9. The golf ball of claim 1, wherein the core has a diameter of from about 1.30 inches to about 1.620 inches.

10. A golf ball comprising:
a core having an outer surface and a geometric center and being formed from a substantially homogenous composition comprising a carbon-carbon initiator;
an intermediate layer disposed about the core and comprising an ionomeric material; and
a cover layer disposed about the intermediate layer, the cover comprising a castable polyurea or a castable polyurethane;
wherein the outer surface has a hardness that differs from a hardness at the geometric center by up to about 5 Shore C.

11. The golf ball of claim 10, wherein the hardness of the outer surface is substantially the same as the hardness at the geometric center.

12. The golf ball of claim 10, wherein the hardness of the outer surface differs from the hardness at the geometric center by less than about 5 Shore C.

13. The golf ball of claim 10, wherein the substantially homogenous composition comprises the carbon-carbon initiator in an amount of from about 0.2 phr to about 2.0 phr.

14. The golf ball of claim 10, the core being molded for from about 8 min. to about 16 min. at a cure temperature of greater than 330° F.

15. The golf ball of claim 10, wherein the rubber composition comprises an antioxidant in a ratio of antioxidant to active initiator used in said rubber composition of about 0.4 or greater.

16. The golf ball of claim 10, wherein the core has a compression of from about 40 atti to about 100 atti.

17. The golf ball of claim 10, wherein the core has a diameter of about 1.30 inches to about 1.620 inches.

18. A golf ball comprising:
a core being formed from a substantially homogenous thermoset rubber composition comprising a carbon-carbon initiator, said core having an outer surface and a geometric center;
a cover layer disposed about the core, said cover layer comprising an ionomer or a highly-neutralized ionomer;
wherein the outer surface has a hardness that differs from a hardness at the geometric center by up to about 5 Shore C.

19. The golf ball of claim 18, wherein the substantially homogenous thermoset rubber composition comprises the carbon-carbon initiator in an amount of from about 0.2 phr to about 2.0 phr.

20. The golf ball of claim 18, wherein the rubber composition comprises an antioxidant in a ratio of antioxidant to active initiator of about 0.4 or greater.

21. The golf ball of claim 18, wherein the geometric center has a hardness of from about 55 Shore C to about 82 Shore C.

22. The golf ball of claim 18, the core being molded for about 8 min. to about 16 min. at a cure temperature of greater than 330° F.

23. The golf ball of claim 18, wherein the core has a compression of from about 40 atti to about 100 atti.

24. The golf ball of claim 18, wherein the core has a diameter of from about 1.30 inches to about 1.620 inches.

* * * * *